United States Patent
Park et al.

(10) Patent No.: US 9,691,684 B2
(45) Date of Patent: Jun. 27, 2017

(54) INTEGRATED CIRCUIT DEVICE INCLUDING THROUGH-SILICON VIA STRUCTURE AND DECOUPLING CAPACITOR AND METHOD OF MANUFACTURING THE SAME

(71) Applicants: Jae-hwa Park, Yongin-si (KR);
Sung-hee Kang, Seongnam-si (KR);
Kwang-jin Moon, Hwaseong-si (KR);
Byung-lyul Park, Seoul (KR);
Suk-chul Bang, Yongin-si (KR)

(72) Inventors: Jae-hwa Park, Yongin-si (KR);
Sung-hee Kang, Seongnam-si (KR);
Kwang-jin Moon, Hwaseong-si (KR);
Byung-lyul Park, Seoul (KR);
Suk-chul Bang, Yongin-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 64 days.

(21) Appl. No.: 14/327,558

(22) Filed: Jul. 9, 2014

(65) Prior Publication Data
US 2015/0028450 A1 Jan. 29, 2015

(30) Foreign Application Priority Data
Jul. 25, 2013 (KR) .................. 10-2013-0088248

(51) Int. Cl.
*H01L 27/108* (2006.01)
*H01L 23/48* (2006.01)
(Continued)

(52) U.S. Cl.
CPC ...... *H01L 23/481* (2013.01); *H01L 21/76898* (2013.01); *H01L 28/90* (2013.01);
(Continued)

(58) Field of Classification Search
None
See application file for complete search history.

(56) References Cited

U.S. PATENT DOCUMENTS 7,332,764 B2  2/2008  Choi et al.
7,943,473 B2 *  5/2011  Ellul .................. H01L 21/6835
                                                            438/381
(Continued)

FOREIGN PATENT DOCUMENTS

KR    20040004809 A       1/2004
KR    20120069797 A  *    6/2012

*Primary Examiner* — David E Graybill
(74) *Attorney, Agent, or Firm* — Renaissance IP Law Group LLP

(57) ABSTRACT

An integrated circuit device is provided which includes a through-silicon via (TSV) structure and one or more decoupling capacitors, along with a method of manufacturing the same. The integrated circuit device may include a semiconductor structure including a semiconductor substrate, a TSV structure passing through the semiconductor substrate, and a decoupling capacitor formed in the semiconductor substrate and connected to the TSV structure. The TSV structure and the one or more decoupling capacitors may be substantially simultaneously formed. A plurality of decoupling capacitors may be disposed within a keep out zone (KOZ) of the TSV structure. The plurality of decoupling capacitors may have the same or different widths and/or depths. An isopotential conductive layer may be formed to reduce or eliminate a potential difference between different parts of the TSV structure.

20 Claims, 35 Drawing Sheets

(51) Int. Cl.
*H01L 49/02* (2006.01)
*H01L 21/768* (2006.01)

(52) U.S. Cl.
CPC ............... *H01L 2224/16225* (2013.01); *H01L 2924/0002* (2013.01); *H01L 2924/15311* (2013.01)

(56) References Cited

U.S. PATENT DOCUMENTS

| | | | |
|---|---|---|---|
| 7,964,972 B2* | 6/2011 | Matsui | H01L 21/76898 257/758 |
| 8,294,240 B2* | 10/2012 | Nowak | H01L 21/76898 257/532 |
| 8,298,906 B2 | 10/2012 | Bernstein et al. | |
| 8,390,098 B2* | 3/2013 | Matsui | H01L 21/76898 257/621 |
| 8,525,296 B1* | 9/2013 | Lin | H01L 29/945 257/532 |
| 8,536,678 B2* | 9/2013 | Nowak | H01L 21/76898 257/532 |
| 8,692,381 B1* | 4/2014 | Hart | H01L 29/66181 257/774 |
| 8,693,163 B2* | 4/2014 | Su | H01L 21/76898 257/301 |
| 8,742,541 B2* | 6/2014 | Mohammed | H01G 4/06 257/298 |
| 8,841,748 B2* | 9/2014 | Joblot | H01L 21/76898 257/532 |
| 8,841,749 B2* | 9/2014 | Joblot | H01L 21/76898 257/532 |
| 9,257,322 B2* | 2/2016 | Chen | H01L 21/76898 |
| 2005/0142733 A1* | 6/2005 | Kurihara | H01G 4/33 438/250 |
| 2006/0001174 A1* | 1/2006 | Matsui | H01L 21/76898 257/774 |
| 2008/0173993 A1* | 7/2008 | Andry | H01G 4/236 257/678 |
| 2010/0164062 A1* | 7/2010 | Wang | H01L 21/76898 257/532 |
| 2010/0178747 A1* | 7/2010 | Ellul | H01L 21/6835 438/386 |
| 2010/0200949 A1 | 8/2010 | Booth, Jr. et al. | |
| 2010/0308435 A1* | 12/2010 | Nowak | H01L 21/76898 257/532 |
| 2011/0095373 A1 | 4/2011 | Hwang et al. | |
| 2011/0169131 A1 | 7/2011 | Nakos et al. | |
| 2011/0210426 A1* | 9/2011 | Matsui | H01L 21/76898 257/621 |
| 2012/0049322 A1* | 3/2012 | Su | H01L 21/76898 257/532 |
| 2012/0091593 A1 | 4/2012 | Cheng et al. | |
| 2012/0326309 A1 | 12/2012 | Andry et al. | |
| 2013/0037910 A1 | 2/2013 | Tzeng et al. | |
| 2013/0040436 A1* | 2/2013 | Nowak | H01L 21/76898 438/386 |
| 2013/0242643 A1* | 9/2013 | Kim | G11C 5/14 365/149 |
| 2014/0124943 A1* | 5/2014 | Behrends | H01L 21/76898 257/774 |
| 2014/0127875 A1* | 5/2014 | Behrends | H01L 21/76898 438/381 |
| 2015/0028450 A1* | 1/2015 | Park | H01L 23/481 257/532 |

* cited by examiner

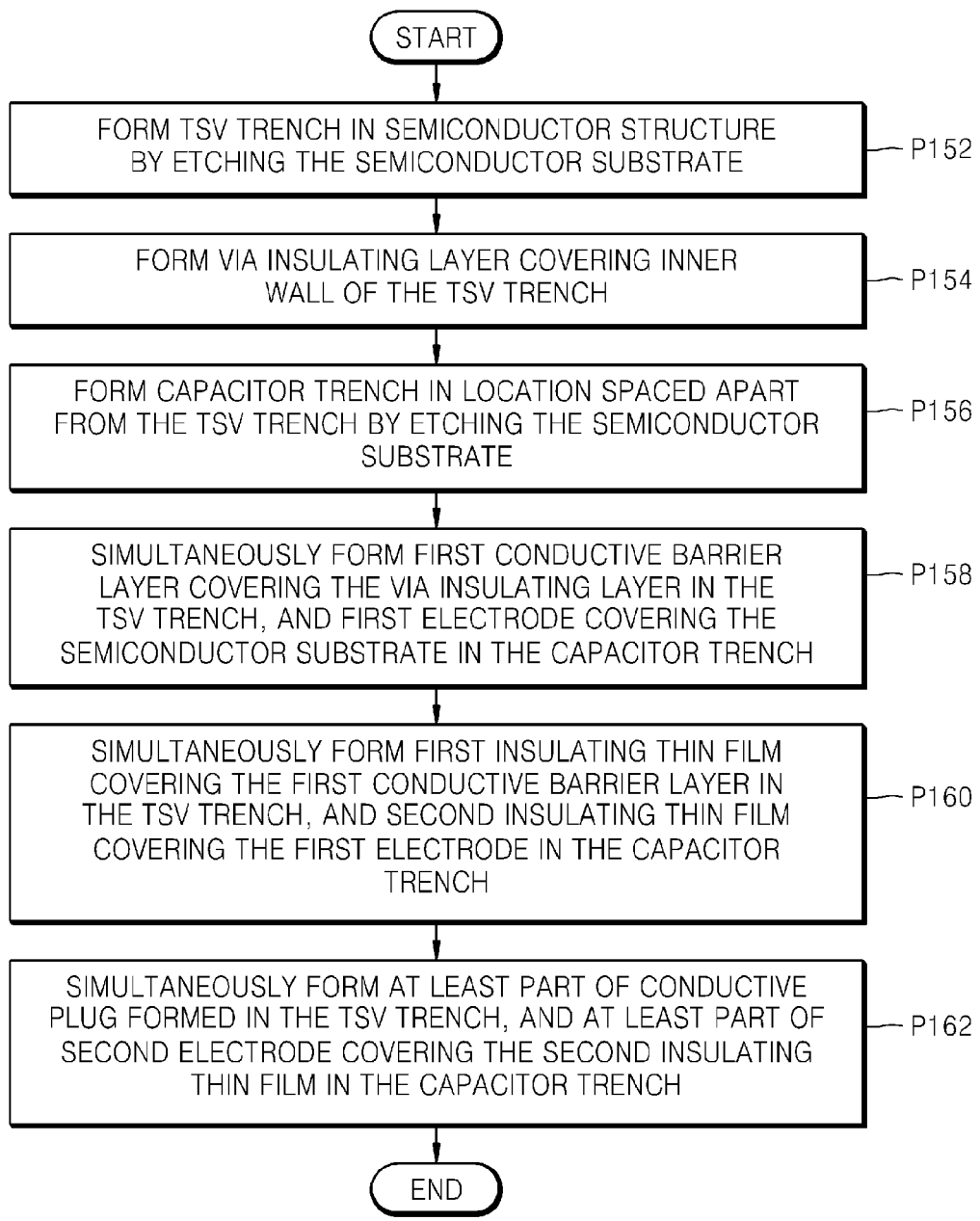

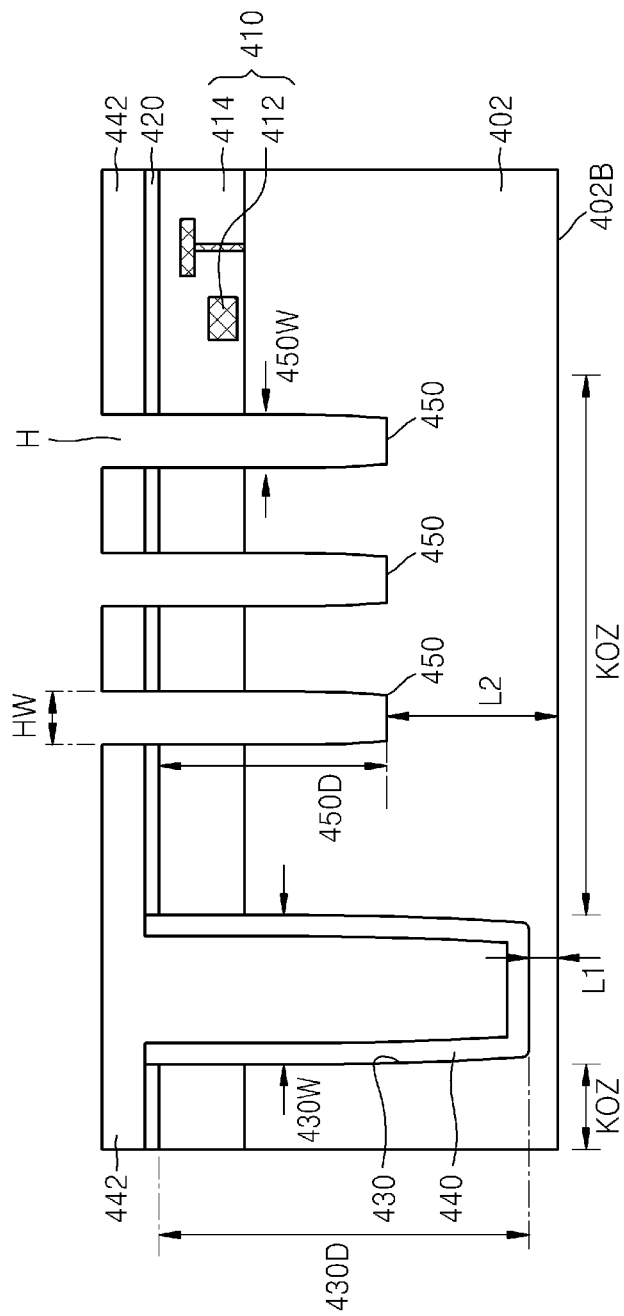

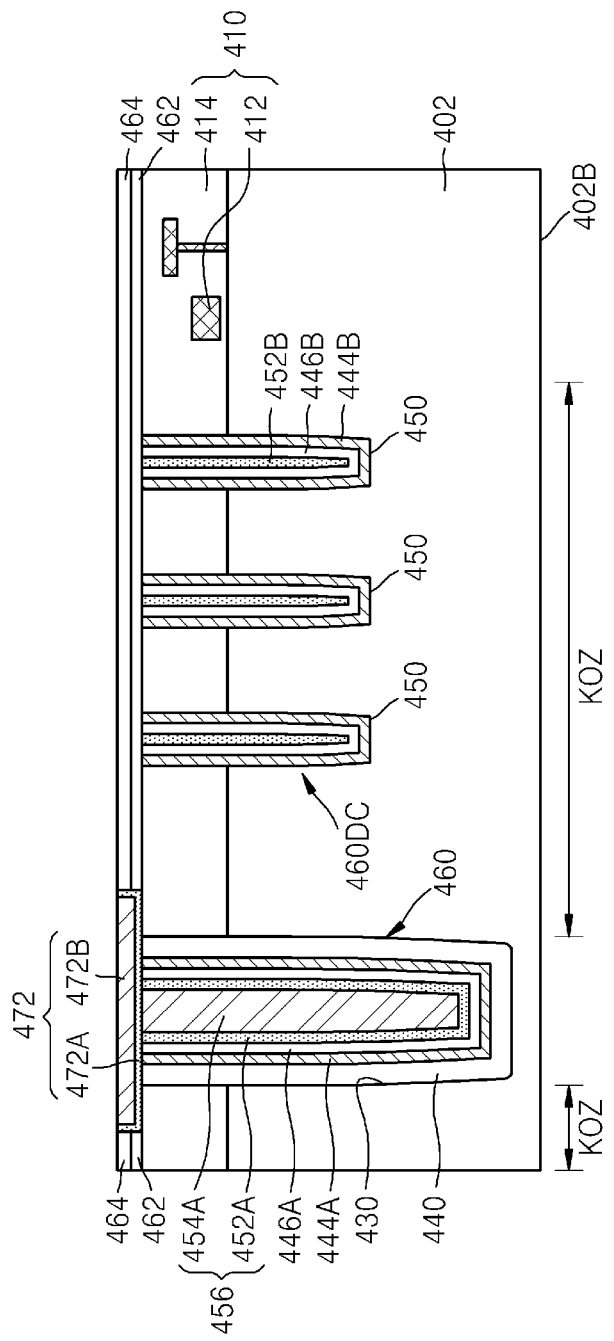

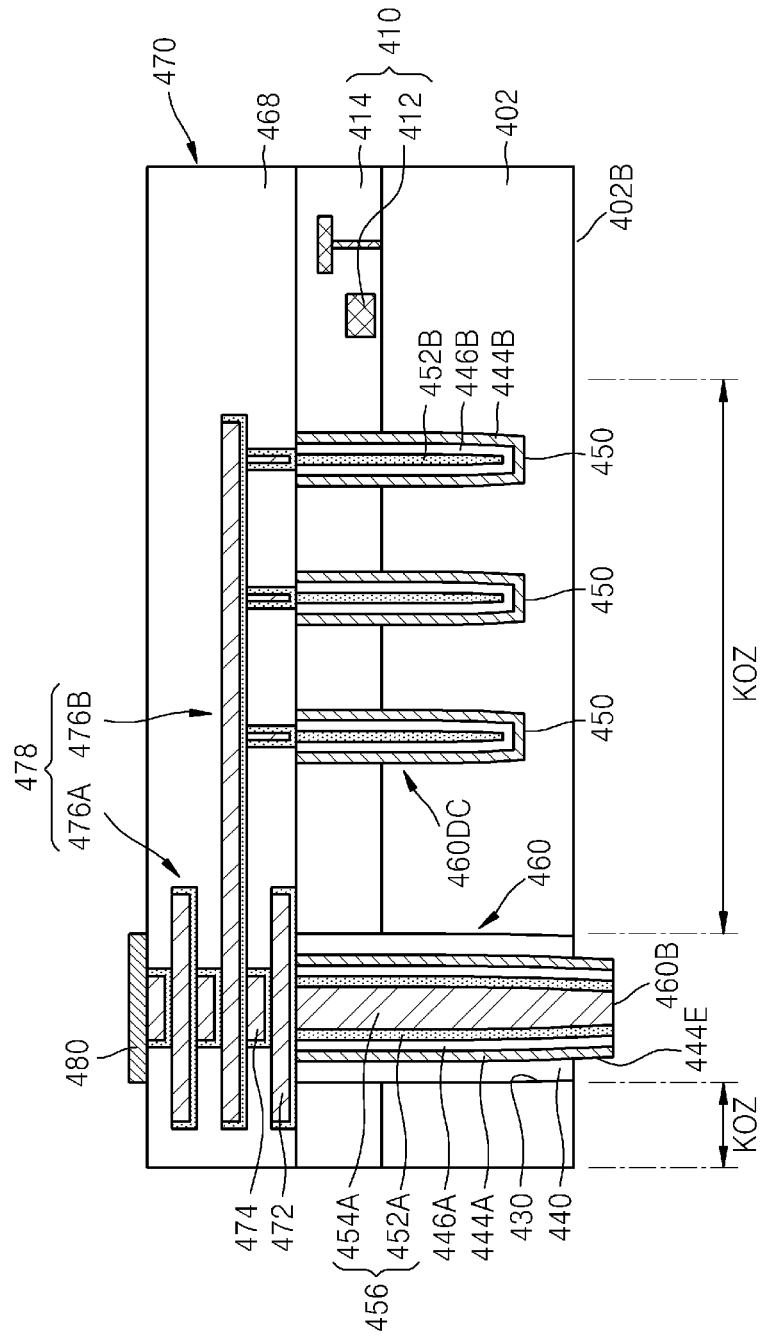

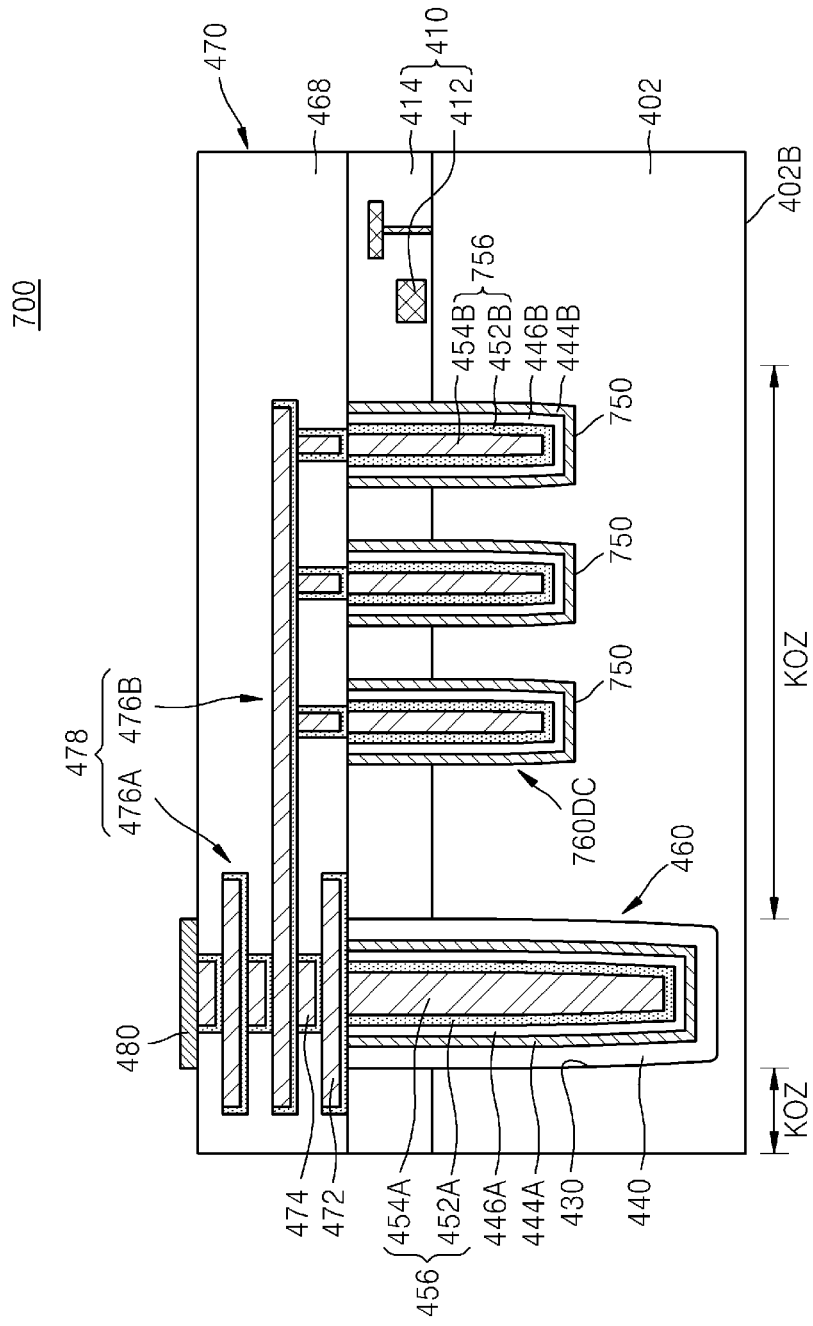

US 9,691,684 B2

INTEGRATED CIRCUIT DEVICE INCLUDING THROUGH-SILICON VIA STRUCTURE AND DECOUPLING CAPACITOR AND METHOD OF MANUFACTURING THE SAME

CROSS-REFERENCE TO RELATED APPLICATIONS

This application claims the benefit of Korean Patent Application No. 10-2013-0088248, filed on Jul. 25, 2013, in the Korean Intellectual Property Office, the disclosure of which is incorporated herein by reference in its entirety.

BACKGROUND

The inventive concepts disclosed herein relate to an integrated circuit device and a method of manufacturing the same, and more particularly, to an integrated circuit device including a through-silicon via (TSV) structure and a decoupling capacitor, as well as a method of manufacturing the same.

A TSV technology for forming a vertical electrical connection passing through a substrate, a die, or the interposer has been considered very important in the development of a three-dimensional (3D) package and a 2.5D package. In a 3D package, a plurality of semiconductor chips are vertically mounted in one semiconductor package. In a 2.5D package, a through-silicon via (TSV) is not applied to an active chip, but to a passive silicon interposer that has a chip flip-chip bonded on the interposer. In order to improve the performance and reliability of 3D and 2.5D packages, there is a need for technology solving a problem caused by a Cu diffusion phenomenon in a TSV structure that includes a Cu contact plug. It would also be desirable to form a device capable of providing stable operating characteristics and high reliability. There is also a need for an integrated circuit device capable of providing higher integration in the 3D or 2.5D package using the TSV structure, along with providing higher reliability of the TSV.

SUMMARY

The inventive concepts provide an integrated circuit device that can help reduce or prevent a phenomenon in which metal ions diffuse from a metal plug with a through-silicon via (TSV) structure into a semiconductor substrate in the periphery of the TSV. The inventive concepts can further help reduce or prevent a switching noise from being generated in a ground surface and a power end due to simultaneous high switching of semiconductor chips. A structure favorable to high integration of a decoupling capacitor is also provided, wherein the decoupling capacitor can function as a filter with respect to an irregular change in a circuit signal, thereby providing a stable operating characteristic and high reliability while further securing higher integration.

The inventive concepts also provide a method of manufacturing an integrated circuit device with a decoupling capacitor structure capable of high integration, thereby helping to reduce or prevent a phenomenon in which metal ions diffuse from a metal plug with a TSV structure into a semiconductor substrate in the periphery of the TSV, and simultaneously providing a structure favorable to high integration and improved reliability of the TSV.

According to an aspect of the inventive concepts, an integrated circuit device may include a semiconductor structure having a semiconductor substrate, a through-silicon via (TSV) structure passing through the semiconductor substrate, and a decoupling capacitor formed in the semiconductor substrate and connected to the TSV structure. The TSV structure may include a conductive plug, a first conductive barrier layer spaced apart from the conductive plug and surrounding the conductive plug, and a first insulating thin film disposed between the conductive plug and the first conductive barrier layer. The decoupling capacitor may include a first electrode formed of the same material as a first material of the first conductive barrier layer, a second electrode spaced apart from the first electrode and formed of the same material as a second material of at least a part of the conductive plug, and a second insulating thin film disposed between the first electrode and the second electrode and formed of the same material as a third material of the first insulating thin film.

Each of the first electrode and the second electrode may include metal.

The conductive plug of the TSV structure may include a metal plug passing through the semiconductor structure and surrounded by the first insulating thin film, and a second conductive barrier layer surrounding an external side wall of the metal plug between the metal plug and the first insulating thin film.

The second electrode of the decoupling capacitor may include the same material as that of the second conductive barrier layer.

The second electrode of the decoupling capacitor may have a stack structure including a first conductive layer formed of the same material as that of the metal plug and a second conductive layer formed of the same material as that of the second conductive barrier layer.

The first conductive barrier layer and the first electrode may include a first metal. The conductive plug and the second electrode may include a second metal different from the first metal.

The integrated circuit device may further include a via insulating layer disposed between the semiconductor substrate and the first conductive barrier layer such that the first conductive barrier layer of the TSV structure is spaced apart from the semiconductor substrate. The first electrode of the decoupling capacitor may contact the semiconductor substrate.

The integrated circuit device may further include an isopotential conductive layer configured to electrically connect the conductive plug and the first conductive barrier layer to each other, such that the conductive plug and the first conductive barrier layer are isopotential to each other.

The isopotential conductive layer may include a first conductive layer contacting one end of the conductive plug and one end of the first conductive bather layer on a first surface of the semiconductor structure, and a second conductive layer contacting another end of the conductive plug and another end of the first conductive barrier layer on a second surface of the semiconductor structure, where the second surface is arranged opposite to the first surface.

The TSV structure and the decoupling capacitor may be connected to each other via the isopotential conductive layer.

The semiconductor structure may be a part of a logic chip, a memory chip, or an interposer.

According to another aspect of the inventive concepts, an integrated circuit device may include a package substrate including a connection terminal, a semiconductor structure including a semiconductor substrate stacked on the package substrate, a TSV structure passing through the semiconductor substrate of the semiconductor structure, and at least one decoupling capacitor formed in the semiconductor substrate of the semiconductor structure and connected to the TSV structure. The TSV structure may include a conductive plug connected to the connection terminal, a first conductive barrier layer spaced apart from the conductive plug and surrounding the conductive plug, and a first insulating thin film disposed between the conductive plug and the first conductive barrier layer. The decoupling capacitor may include a first electrode formed of the same material as a first material of the first conductive barrier layer, a second electrode spaced apart from the first electrode and formed of the same material as a second material of at least a part of the conductive plug, and a second insulating thin film disposed between the first electrode and the second electrode and formed of the same material as a third material of the first insulating thin film.

A plurality of decoupling capacitors may be connected to each other in parallel.

The plurality of decoupling capacitors may be formed in a plurality of trenches formed in the semiconductor substrate. The plurality of trenches may be spaced apart from each other. The plurality of trenches may further include at least two trenches with different depths.

According to another aspect of the inventive concepts, a method of manufacturing an integrated circuit device may include etching the semiconductor substrate to form a TSV trench having a first bottom surface in a first region of a semiconductor structure including a semiconductor substrate. A via insulating layer may then be formed covering an inner wall of the TSV trench, and a capacitor trench may be formed having a second bottom surface in a second region of the semiconductor structure by etching the semiconductor substrate. A multilayer structure may be simultaneously formed including a first conductive layer, a first insulating thin film, and a second conductive layer spaced apart from the first conductive layer. The second conductive layer may sequentially cover the via insulating layer in the TSV trench, and a decoupling capacitor. The decoupling capacitor may include a first electrode, a second insulating thin film, and a second electrode that are disposed in the capacitor trench. An isopotential conductive layer may be formed to connect the first conductive layer and the second conductive layer to each other at an entrance of the TSV trench.

The first conductive layer and the first electrode may include a first metal. The second conductive layer and the second electrode may include a second metal.

The first electrode may include the same material as that of the first conductive layer. The second insulating thin film may include the same material as that of the first insulating thin film. The second electrode may include the same material as that of the second conductive layer.

A distance from a top surface of the semiconductor substrate to the first bottom surface may be greater than that from the top surface of the semiconductor substrate to the second bottom surface.

The second region may be disposed within a range of 20 µm from the TSV trench.

The method may further include forming a wiring layer configured to connect the isopotential conductive layer and the decoupling capacitor to each other, after forming the isopotential conductive layer.

According to another aspect of the inventive concepts, a method of manufacturing an integrated circuit device may include forming a TSV trench in a semiconductor structure including a semiconductor substrate by etching the semiconductor substrate. A via insulating layer may be formed covering an inner wall of the TSV trench. A capacitor trench may be formed in a location spaced apart from the TSV trench by etching the semiconductor substrate. A first conductive barrier layer and a first electrode may be simultaneously formed, where the first conductive barrier layer covers the via insulating layer in the TSV trench, and the first electrode covers an exposure region of the semiconductor substrate in the capacitor trench. A first insulating thin film covering the first conductive barrier layer in the TSV trench, and a second insulating thin film covering the first electrode in the capacitor trench may be simultaneously formed. And at least a part of a conductive plug surrounded by the first insulating thin film in the TSV trench may be simultaneously formed with at least a part of a second electrode covering the second insulating thin film in the capacitor trench.

Simultaneously forming at least a part of the conductive plug and at least a part of the second electrode may include simultaneously forming a second conductive barrier layer that is a part of the conductive plug on the first insulating thin film and the second electrode in the TSV trench.

The method may further include forming a metal plug that is another part of the conductive plug in the TSV trench after forming the second electrode, forming an isopotential conductive layer that connects the conductive plug and the first conductive barrier layer to each other, and forming a wiring layer which connects the second electrode and the isopotential conductive layer.

Simultaneously forming at least a part of the conductive plug and at least a part of the second electrode may include simultaneously forming a second conductive barrier layer that is a part of the conductive plug in the TSV trench and an external second electrode layer that is a part of the second electrode in the capacitor trench. A metal plug that is another part of the conductive plug in the TSV trench and an internal second electrode layer that is another part of the second electrode in the capacitor trench may also be simultaneously formed.

BRIEF DESCRIPTION OF THE DRAWINGS

Exemplary embodiments of the inventive concepts will be more clearly understood from the following detailed description taken in conjunction with the accompanying drawings, in which:

FIG. 9 is a flowchart illustrating steps of a method of manufacturing an integrated circuit device according to another embodiment of the inventive concepts;

FIGS. 13A through 13E are somewhat schematic cross-sectional views of an integrated circuit device being constructed using a method of manufacturing an integrated circuit device according to another embodiment of the inventive concepts;

DETAILED DESCRIPTION OF THE EMBODIMENTS

Figure 1:
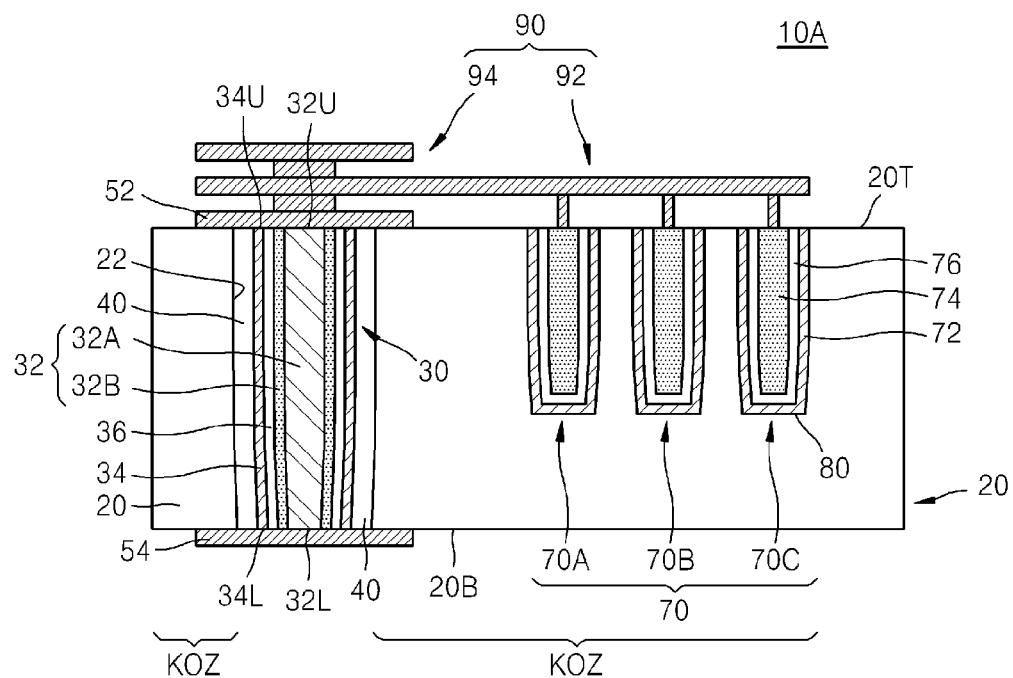
FIG. 1 is a somewhat schematic cross-sectional view of an integrated circuit device according to an embodiment of the inventive concepts.

The inventive concepts will now be described more fully with reference to the accompanying drawings, in which exemplary embodiments of the inventive concepts are shown. The same elements in the drawings are denoted by the same reference numerals and repeated explanations thereof will therefore be omitted.

In the accompanying drawings, elements of the inventive concepts are shown. The inventive concepts may, however, be embodied in many different forms and should not be construed as being limited to the exemplary embodiments set forth herein. Rather, these embodiments are provided so that this disclosure will be thorough and complete, and will fully convey the scope of the inventive concepts to one of ordinary skill in the art.

It will be understood that, although the terms first, second, third, etc., may be used herein to describe various elements, components, regions, layers and/or sections, these elements, components, regions, layers and/or sections should not be limited by these terms. Rather, these terms are only used to distinguish one element, component, region, layer or section from another region, layer or section. Thus, a first element, component, region, layer or section discussed below could be termed a second element, component, region, layer or section without departing from the teachings of the inventive concepts. For example, a first element may be named a second element and, similarly, a second element may be named a first element without departing from the scope of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In other embodiments, a specific order of processes may be changed. For example, two processes which are explained sequentially may be substantially simultaneously performed, or may be performed in an order opposite to that explained.

Variations from the shapes of elements shown in the illustrations which result, for example, from manufacturing techniques and/or tolerances, are to be expected. Thus, exemplary embodiments should not be construed as being limited to the particular shapes of regions illustrated herein but may be interpreted to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list.

FIG. 1 is a somewhat schematic cross-sectional view of an integrated circuit device 10A according to an embodiment of the inventive concepts.

Referring to FIG. 1, the integrated circuit device 10A constructed according to this embodiment includes a semiconductor structure 20 including a semiconductor substrate, a through-silicon via (TSV) structure 30 formed in a via hole 22 passing through the semiconductor structure 20, and at least one decoupling capacitor 70 that is formed in the semiconductor structure 20 and is connected to the TSV structure 30.

The decoupling capacitor 70 may include a plurality of decoupling capacitors 70A, 70B, and 70C that are connected to each other in parallel. Although three, parallel-connected decoupling capacitors 70A, 70B, and 70C are shown in FIG. 1, the inventive concepts are not limited thereto. The decoupling capacitor 70 may be designed in various ways depending on the capacitance required by the integrated circuit device 10A.

A metal, used in the TSV structure 30, and the semiconductor substrate (for example, a silicon substrate), included in the semiconductor structure 20, may have different thermal expansion coefficients. Due to a difference in the thermal expansion coefficients, when a temperature change occurs in the integrated circuit device 10A, the TSV structure 30 may apply a thermal stress or a physical stress to the semiconductor substrate adjacent thereto. As such, a crack may occur in the semiconductor substrate, or the semiconductor substrate may be damaged due to the stress applied to the semiconductor substrate. The stress applied to the semiconductor substrate may further cause a change in mobility of holes or electrons in the integrated circuit device 10A and may result in a performance deterioration of the integrated circuit device 10A. A keep-out zone (KOZ) may be provided around the TSV structure 30 in which devices such as logic cells or transistors are not permitted to be formed. The KOZ may, for example, be within a distance of about 20 μm from the TSV structure 30.

When the integrated circuit device 10A is a digital circuit, for instance, the KOZ may be within a distance of about 10 μm from the TSV structure 30. When the integrated circuit device 10A is an analog circuit, the KOZ may, for instance, be within a distance of about 20 μm from the TSV structure 30.

The decoupling capacitors 70A, 70B, and 70C may be formed in the KOZ.

The TSV structure 30 may include a conductive plug 32 and a first conductive barrier layer 34 that is spaced apart from and surrounds the conductive plug 32. A first insulating thin film 36 is disposed between the conductive plug 32 and the first conductive barrier layer 34.

The conductive plug 32 may include a metal plug 32A passing through the semiconductor structure 20 and a second conductive bather layer 32B that surrounds an external side wall of the metal plug 32A and passes through the second semiconductor structure 32B. The second semiconductor structure 32B is disposed between the metal plug 32A and the first insulating thin film 36. In some embodiments, the second semiconductor structure 32B may be omitted, and the metal plug 32A may directly contact the first insulating thin film 36.

The integrated circuit device 10A may further include a via insulating layer 40 disposed between the semiconductor structure 20 and the first conductive barrier layer 34. The TSV structure 30 may be spaced apart from the semiconductor structure 20 by the via insulating layer 40.

The first conductive barrier layer 34, the metal plug 32A, and the second conductive barrier layer 32B may each include metal. In some embodiments, the metal plug 32A may include a first metal, and the first conductive barrier layer 34 and the second conductive barrier layer 32B may each include a metal different from the first metal.

Each of the decoupling capacitors 70A, 70B, and 70C may include a first electrode 72, a second electrode 74, and a second insulating thin film 76 disposed between the first electrode 72 and the second electrode 74. The first electrode 72 of each of the decoupling capacitors 70A, 70B, and 70C may directly contact the semiconductor substrate included in the semiconductor structure 20.

The first electrode 72 may be formed of the same material as that of the first conductive barrier layer 34. The second electrode 74 may be spaced apart from the first electrode 72 and may be formed of the same material as that of the second conductive barrier layer 32B that is a part of the conductive plug 32. The second insulating thin film 76 may be formed of the same material as that of the first insulating thin film 36.

Similar to the first conductive barrier layer 34 and the second conductive barrier layer 32B, the first electrode 72 and second electrode 74 may each include metal.

In some embodiments, the metal plug 32A of the TSV structure 30 may include Cu or W. For example, the metal plug 32A may be formed of Cu, CuSn, CuMg, CuNi, CuZn, CuPd, CuAu, CuRe, CuW, W, or WN, but is not limited thereto.

The second conductive barrier layer 32B, surrounding the side wall of the metal plug 32A of the TSV structure 30 and the second electrode 74 of each of the decoupling capacitors 70A, 70B, and 70C, may have a single layer structure or a multilayer structure including at least one material selected from W, WN, WC, Ti, TiN, Ta, TaN, Ru, Co, Mn, WN, Ni, and NiB. In some embodiments, a physical vapor deposition (PVD) process or a chemical vapor deposition (CVD) process may be used to form the second conductive barrier layer 32B and the second electrode 74. In other embodiments, an atomic layer deposition (ALD) process may be used to form the second conductive barrier layer 32B and the second electrode 74.

In some embodiments, the second conductive barrier layer 32B of the TSV structure 30 may have an approximately uniform thickness along a length of the TSV structure 30. The length of the TSV structure 30 extends from a first surface 20T (e.g., a frontside) of the semiconductor structure 20 to a second surface 20B (e.g., a backside) thereof. In the present specification, a length direction of the via hole 22 is the same as a length direction of the TSV structure 30.

In other embodiments, the thickness of the second conductive barrier layer 32B of the TSV structure 30 may decrease closer to the second surface 20B of the semiconductor structure 20. For example, the second conductive barrier layer 32B may have a first thickness in the range of between about 100 Å to about 1000 Å near an entrance of the via hole 22 at a first surface 20T of the semiconductor structure 20, and have a second thickness in the range of between about 0 Å to about 50 Å near an entrance of the via hole 22 at a second surface 20B of the semiconductor structure 20. The PVD process may, for instance, be used to form the second conductive barrier layer 32B having a variable thickness along the length of the via hole 22.

The first conductive barrier layer 34 of the TSV structure 30 and the first electrode 72 of each of the decoupling capacitors 70A, 70B, and 70C may be configured as conductive layers having relatively low wiring resistance. The first conductive barrier layer 34 and the first electrode 72 may have a single layer structure or a multilayer structure including at least one material selected from the group including W, WN, Ti, TiN, Ta, TaN, and Ru. For example, the first conductive barrier layer 34 and the first electrode 72 may have a multilayer structure including TaN/W, TiN/W, or WN/W. The first conductive barrier layer 34 and the first electrode 72 may have a thickness in the range of between about 50 to about 1000 Å.

In some embodiments, the first conductive barrier layer 34 may have an approximately uniform thickness along the length of the TSV structure 30. An ALD process or a CVD process may be used to form the first conductive barrier layer 34 and the first electrode 72.

The first insulating thin film 36 of the TSV structure 30 may have a cylinder type structure that surrounds the conductive plug 32. The first insulating thin film 36 of the TSV structure 30 and the second insulating thin film 76 of each of the decoupling capacitors 70A, 70B, and 70C may include an oxide film, a nitride film, an insulating metal oxide film, a high dielectric film, a polymer film, or combinations thereof. The first insulating thin film 36 may be formed as a high-density thin film having an approximately uniform thickness along the length of the TSV structure 30. For example, the first insulating thin film 36 and the second insulating thin film 76 may be formed as thin films using an ALD process.

In some embodiments, the first insulating thin film 36 and the second insulating thin film 76 may be formed as high dielectric layers having a dielectric constant higher than that of a silicon oxide layer. For example, the first insulating thin film 36 and the second insulating thin film 76 may have a dielectric constant in the range of between about 10 to about 25. In some embodiments, the first insulating thin film 36 and the second insulating thin film 76 may be formed of at least one material selected from the group including hafnium oxide (HfO), hafnium silicon oxide (HfSiO), hafnium oxynitride (HfON), hafnium silicon oxynitride (HfSiON), lanthanum oxide (LaO), lanthanum (La), uranium aluminum oxide (LaAlO), zirconium oxide (ZrO), zirconium silicon oxide (ZrSiO), zirconium oxide nitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

The via insulating layer 40 may be formed of an oxide layer, a nitride layer, a carbide layer, a polymer layer, or combinations thereof. In some embodiments, a CVD process may be used to form the via insulating layer 40. The via insulating layer 40 may be formed having a thickness ranging between about 500 to about 2500 Å.

The first insulating thin film 36 of the TSV structure 30 may be spaced apart from the via insulating layer 40, with the first conductive barrier layer 34 disposed therebetween. To minimize the resistance in the TSV structure 30, the thickness of the first insulating thin film 36 may be formed to be as small as possible. In some embodiments, thicknesses of the first insulating thin film 36 and the second insulating thin film 76 may be smaller than that of the via insulating layer 40. In some embodiments, the first insulating thin film 36 and the second insulating thin film 76 may have a thickness in the range of between about 50 to about 1000 Å.

A first conductive layer 52 may be formed on the first surface 20T of the semiconductor structure 20. The first conductive layer 52 contacts one end 32U of the conductive plug 32 and one end 34U of the first conductive barrier layer 34. A second conductive layer 54 may be formed on the second surface 20B of the semiconductor structure 20. The second conductive layer 54 contacts another end 32L of the conductive plug 32 and another end 34L of the first conductive barrier layer 34. The first conductive layer 52 and the second conductive layer 54 may be used as isopotential conductive layers. That is, isopotential conductive layers configured as the first conductive layer 52 and the second conductive layer 54 may function to electrically connect the conductive plug 32 and the first conductive barrier layer 34 to each other such that the conductive plug 32 and the first conductive barrier layer 34 may be isopotential to each other when a voltage is applied to the TSV structure 30.

The first conductive layer 52 and the second conductive layer 54 may be formed of metal. The conductive plug 32 and the first conductive barrier layer 34 are each connected to the first conductive layer 52 and the second conductive layer 54. Thus, a voltage applied to the conductive plug 32 from one of the first conductive layer 52 and the second conductive layer 54 may be simultaneously supplied from the conductive plug 32 and the first conductive barrier layer 34 so that the conductive plug 32 and the first conductive bather layer 34 may be in an isopotential status. For example, when the conductive plug 32 includes metal ions (such as Cu ions) that easily diffuse due to a potential difference, the first conductive barrier layer 34 (having the same isopotentiality as that of the conductive plug 32) surrounds the conductive plug 32 with the first insulating thin film 36 disposed therebetween, thereby electrically shielding metal ions from internally diffusing into the semiconductor structure 20 from the conductive plug 32 due to the potential difference. Thus, problems that may otherwise result from metal ions internally diffusing into the semiconductor structure 20 due to the potential difference may be avoided. For example, deterioration of operating characteristics of unit devices such as a transistor, drop in the reliability of the TSV structure 30 due to metal ions that internally diffuse in the via insulating layer 40 and then serve as trap sites in the via insulating layer 40, and other problems, may be avoided.

The TSV structure 30 and the decoupling capacitor 70 may be connected to each other via the first conductive layer 52 configured as the isopotential conductive layer. To provide the connection between the TSV structure 30 and the decoupling capacitor 70, a wiring structure 90 may be connected between the first conductive layer 52 and the decoupling capacitor 70. The wiring structure 90 may include a first wiring structure 92 for connecting the decoupling capacitors 70A, 70B, and 70C to each other in parallel, and a second wiring structure 94 for connecting the parallel-connected decoupling capacitors 70A, 70B, and 70C to the TSV structure 30. The first wiring structure 92 may be connected to the second electrode 74 of each of the decoupling capacitors 70A, 70B, and 70C. The wiring structure 90 of FIG. 1 is merely an example, however, and the wiring structure 90 may have various shapes and structures depending on a design of the integrated circuit device 10A.

In some embodiments, the semiconductor structure 20 may include the semiconductor substrate, for example, a silicon substrate. The TSV structure 30 may have its side wall surrounded by the semiconductor substrate. The decoupling capacitors 70A, 70B, and 70C may be formed in a plurality of capacitor trenches 80 formed in the semiconductor substrate. As an example, the trenches 80 may be disposed spaced apart from each other in the semiconductor substrate. As another example, the capacitor trenches 80 may communicate with one another.

In some embodiments, each of the capacitor trenches 80 may have a planar structure that appears as a plurality of line shapes connected to each other in parallel. In other embodiments, each of the capacitor trenches 80 may have a planar structure that appears as a concentric shape, or a planar structure having a spiral shape. Depending on the planar structures of the capacitor trenches 80, each of the decoupling capacitors 70A, 70B, and 70C formed in the capacitor trenches 80 may have planar structures that correspond to the shapes of the trenches 80. However, the inventive concept is not limited to the above structures. The capacitor trenches 80 and the decoupling capacitors 70A, 70B, and 70C may have various additional shapes and structures without departing from the scope of the inventive concepts.

In other embodiments, the semiconductor structure 20 may include the semiconductor substrate and an interlayer insulating layer covering the semiconductor substrate. The conductive plug 32, the first insulating thin film 36, and the first conductive barrier layer 34 that are included in the TSV structure 30 may pass through the semiconductor substrate and the interlayer insulating layer. The TSV structure 30 may have a side wall portion surrounded by the semiconductor substrate and another side wall portion surrounded by the interlayer insulating layer. The capacitor trenches 80, in which the decoupling capacitors 70A, 70B, and 70C are formed, may pass through the interlayer insulating layer and extend into the semiconductor substrate. The first electrode 72 may include a portion contacting the interlayer insulating layer and another portion contacting the semiconductor substrate. In this case, the wiring structure 90 may be formed on the interlayer insulating layer.

In other embodiments, the semiconductor layer 20 may include the semiconductor substrate, the interlayer insulating layer covering the semiconductor substrate, and a metal interlayer insulating layer covering the interlayer insulating layer. The conductive plug 32, the first insulating thin film 36, and the first conductive barrier layer 34 that are included in the TSV structure 30 may pass through the semiconductor substrate, the interlayer insulating layer, and the metal interlayer insulating layer, respectively. Each of the conductive plug 32, the first insulating thin film 36, and the first conductive barrier layer 34 of the TSV structure 30 may include a side wall portion surrounded by the semiconductor substrate, another side wall portion surrounded by the interlayer insulating layer, and another side wall portion surrounded by the metal interlayer insulating layer. The capacitor trenches 80, in which the decoupling capacitors 70A, 70B, and 70C are formed, may pass through the interlayer insulating layer and the metal interlayer insulating layer, and extend into the semiconductor substrate. The first electrode 72 may include a portion contacting the metal interlayer insulating layer, another portion contacting the interlayer insulating layer, and another portion contacting the semiconductor substrate. In this case, the wiring structure 90 may be formed on the metal interlayer insulating layer.

In some embodiments, the semiconductor structure 20 may be configured as a logic chip, a memory chip, or an interposer.

Figure 2:
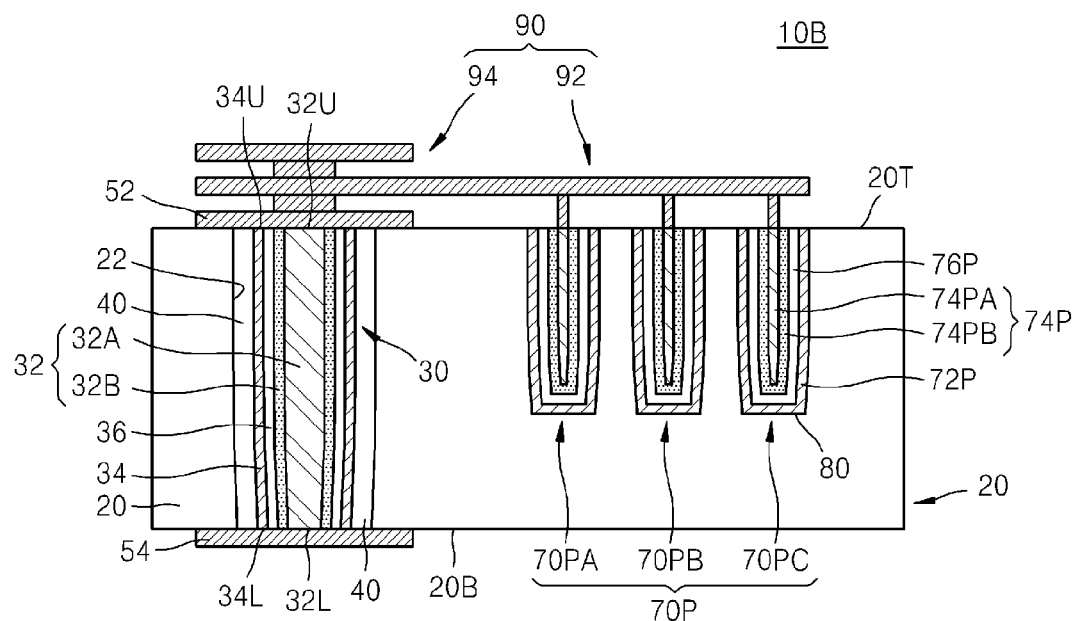
FIG. 2 is a somewhat schematic cross-sectional view of an integrated circuit device according to another embodiment of the inventive concepts.

FIG. 2 is a somewhat schematic cross-sectional view of an integrated circuit device 10B according to another embodiment of the inventive concepts. The same reference numerals described previously with respect to FIG. 1 denote the same elements, and redundant descriptions thereof are omitted here.

Referring to FIG. 2, the integrated circuit device 10B includes the semiconductor structure 20, and the TSV structure 30 formed in the via hole 22 passing through the semiconductor structure 20. At least one decoupling capacitor 70P is formed in the semiconductor structure 20 and is connected to the TSV structure 30.

The decoupling capacitor 70P may include a plurality of decoupling capacitors 70PA, 70PB, and 70PC that are connected to each other in parallel. Each of the decoupling capacitors 70PA, 70PB, and 70PC may include a first electrode 72P, a second electrode 74P, and a second insulating thin film 76P disposed between the first electrode 72P and the second electrode 74P. The first electrode 72P of each of the decoupling capacitors 70PA, 70PB, and 70PC may directly contact a semiconductor substrate included in the semiconductor structure 20.

The first electrode 72P may be formed of the same material as that of the first conductive barrier layer 34. The second electrode 74P may be spaced apart from the first electrode 72P. The second electrode 74P may have a stack structure including an internal second electrode layer 74PA that is formed of the same material as that of the first conductive barrier layer 32A of the TSV structure 30, and an external second electrode layer 74PB that is formed of the same material as that of the second conductive barrier layer 32B of the TSV structure 30.

In some embodiments, the internal second electrode layer 74PA of the second electrode 74P may include Cu or W, like the metal plug 32A of the TSV structure 30. For example, the internal second electrode layer 74PA may be formed of Cu, CuSn, CuMg, CuNi, CuZn, CuPd, CuAu, CuRe, CuW, W, or WN, but is not limited thereto.

In some embodiments, the external second electrode layer 74PB of the second electrode 74P may have a single layer structure or a multilayer structure including at least one material selected from among W, WN, WC, Ti, TiN, Ta, TaN, Ru, Co, Mn, WN, Ni, and NiB. The second electrode layer 74PB may have the same structure as the second conductive barrier layer 32B surrounding a side wall of the metal plug 32A of the TSV structure 30. In some embodiments, a PVD process, a CVD process, or an ALD process may be used to form the second electrode 74P.

The structures of the first electrode 72P and the second insulating thin film 76P of the decoupling capacitor 70P may be the same as the first electrode 72 and the second insulating thin film 76 of the decoupling capacitor 70 of FIG. 1.

The TSV structure 30 and the decoupling capacitor 70P are connected to each other via the first conductive layer 52. The first conductive layer 52 may be configured as an isopotential conductive layer. The wiring structure 90 is connected between the first conductive layer 52 and the decoupling capacitor 70P to provide a connection between the TSV structure 30 and the decoupling capacitor 70P. The wiring structure 90 may include a first wiring structure 92 for connecting the decoupling capacitors 70PA, 70PB, and 70PC to each other in parallel, and a second wiring structure 94 for connecting the parallel-connected decoupling capacitors 70PA, 70PB, and 70PC to the TSV structure 30. The first wiring structure 92 may be connected to the second electrode 74P of each of the decoupling capacitors 70PA, 70PB, and 70PC.

Figure 3:
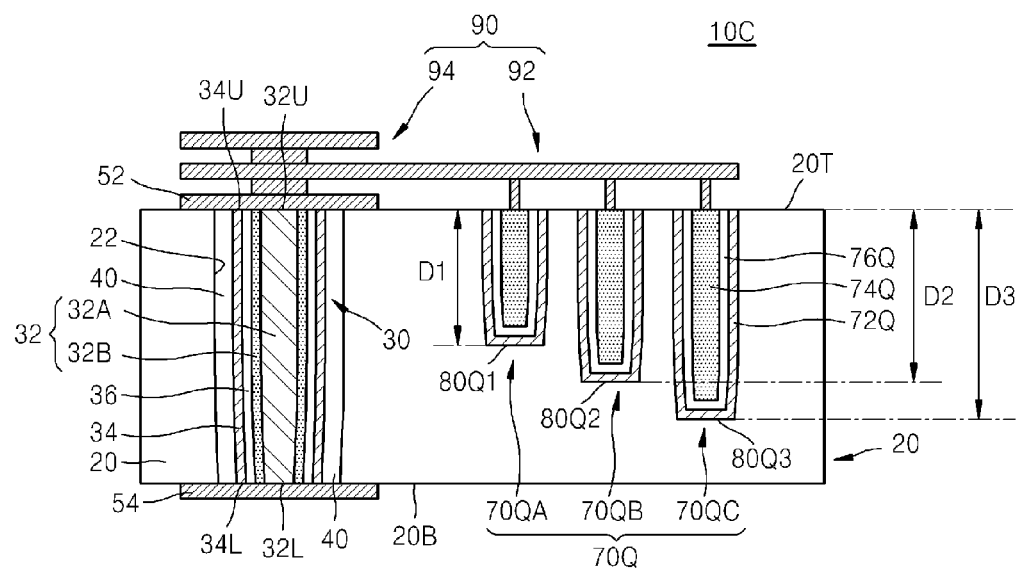
FIG. 3 is a somewhat schematic cross-sectional view of an integrated circuit device according to another embodiment of the inventive concepts.

FIG. 3 is a somewhat schematic cross-sectional view of an integrated circuit device 10C according to another embodiment of the inventive concepts. The same reference numerals denote the same elements, and redundant descriptions thereof are therefore omitted.

Referring to FIG. 3, the integrated circuit device 10C includes the semiconductor structure 20, the TSV structure 30 formed in the via hole 22 passing through the semiconductor structure 20, and at least one decoupling capacitor 70Q that is formed in the semiconductor structure 20 and is connected to the TSV structure 30.

The decoupling capacitor 70Q may include a plurality of decoupling capacitors 70QA, 70QB, and 70QC that are connected to each other in parallel. Each of the decoupling capacitors 70QA, 70QB, and 70QC may include a first electrode 72Q, a second electrode 74Q, and a second insulating thin film 76Q disposed between the first electrode 72Q and the second electrode 74Q. The first electrode 72Q of each of the decoupling capacitors 70QA, 70QB, and 70QC may directly contact a semiconductor substrate included in the semiconductor structure 20.

The decoupling capacitors 70QA, 70QB, and 70QC may be formed in a plurality of trenches 80Q1, 80Q2, and 80Q3 formed in the semiconductor substrate. One or more of the trenches 80Q1, 80Q2, and 80Q3 may have a different depth D1, D2, and D3, respectively, than the others. The depths D1, D2, and D3 of the trenches 80Q1, 80Q2, and 80Q3 may be determined based upon a capacitance required by the integrated circuit device 10C.

The structures of the first electrode 72Q, the second electrode 74Q, and the second insulating thin film 76Q of the decoupling capacitor 70Q may be the same as was described previously with respect to the first electrode 72, the second electrode 74, and the second insulating thin film 76 of the decoupling capacitor 70 of FIG. 1.

Figure 4:
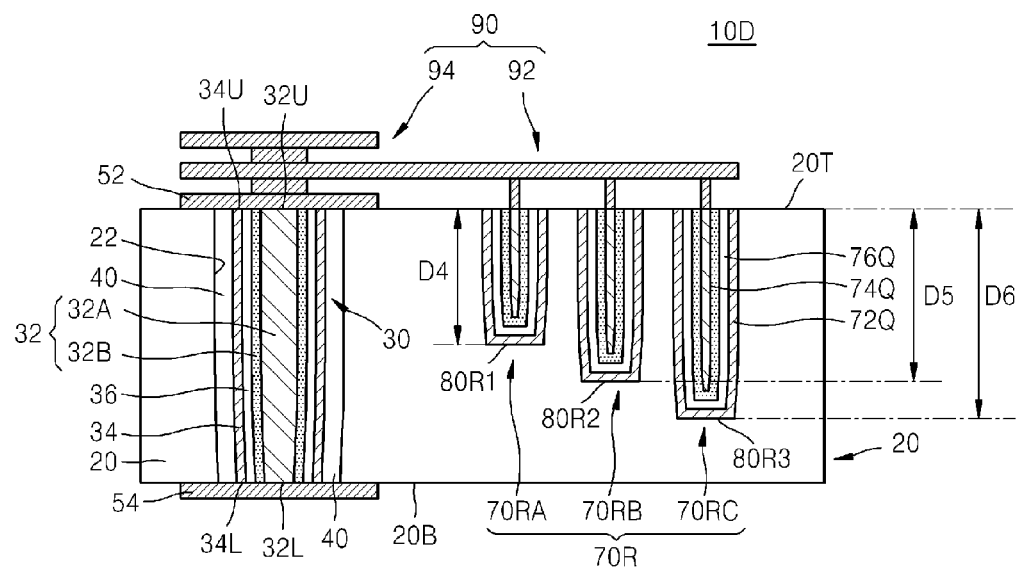
FIG. 4 is a somewhat schematic cross-sectional view of an integrated circuit device according to another embodiment of the inventive concepts.

FIG. 4 is a somewhat schematic cross-sectional view of an integrated circuit device 10D according to another embodiment of the inventive concepts. The same reference numerals denote the same elements, and redundant descriptions thereof are omitted.

Referring to FIG. 4, the integrated circuit device 10D includes the semiconductor structure 20, the TSV structure 30 formed in the via hole 22 passing through the semiconductor structure 20, and at least one decoupling capacitor 70R that is formed in the semiconductor structure 20 and is connected to the TSV structure 30.

The decoupling capacitor 70R may include a plurality of decoupling capacitors 70RA, 70RB, and 70RC that are connected to each other in parallel. Each of the decoupling capacitors 70RA, 70RB, and 70RC may include a first electrode 72R, a second electrode 74R, and a second insulating thin film 76R disposed between the first electrode 72R and the second electrode 74R.

The first electrode 72R may be formed of the same material as that of the first conductive barrier layer 34. The second electrode 74R may be spaced apart from the first electrode 72R. The second electrode 74R may have a stack structure including a first conductive layer 74RA that is formed of the same material as that of the first conductive bather layer 32A of the TSV structure 30, and a second conductive layer 74RB that is formed of the same material as that of the second conductive barrier layer 32B of the TSV structure 30.

The decoupling capacitors 70RA, 70RB, and 70RC may be formed in a plurality of trenches 80R1, 80R2, and 80R3 formed in a semiconductor substrate of the semiconductor structure 20. One or more of the trenches 80R1, 80R2, and 80R3 may have a different depth D4, D5, and D6, respectively, than the other trenches. The depths D4, D5, and D6 of the trenches 80R1, 80R2, and 80R3 may be determined based upon a capacitance required by the integrated circuit device 10D.

The structures of the first electrode 72R, the first conductive layer 74RA and the second conductive layer 74RB of the second electrode 74R, and the second insulating thin film 76R of the decoupling capacitor 70R may be the same as those described previously with reference to the first electrode 72P, the internal second electrode layer 74PA and the external second electrode layer 74PB of the second electrode 74P, and the second insulating thin film 76P of the decoupling capacitor 70P of FIG. 2.

Figure 5:
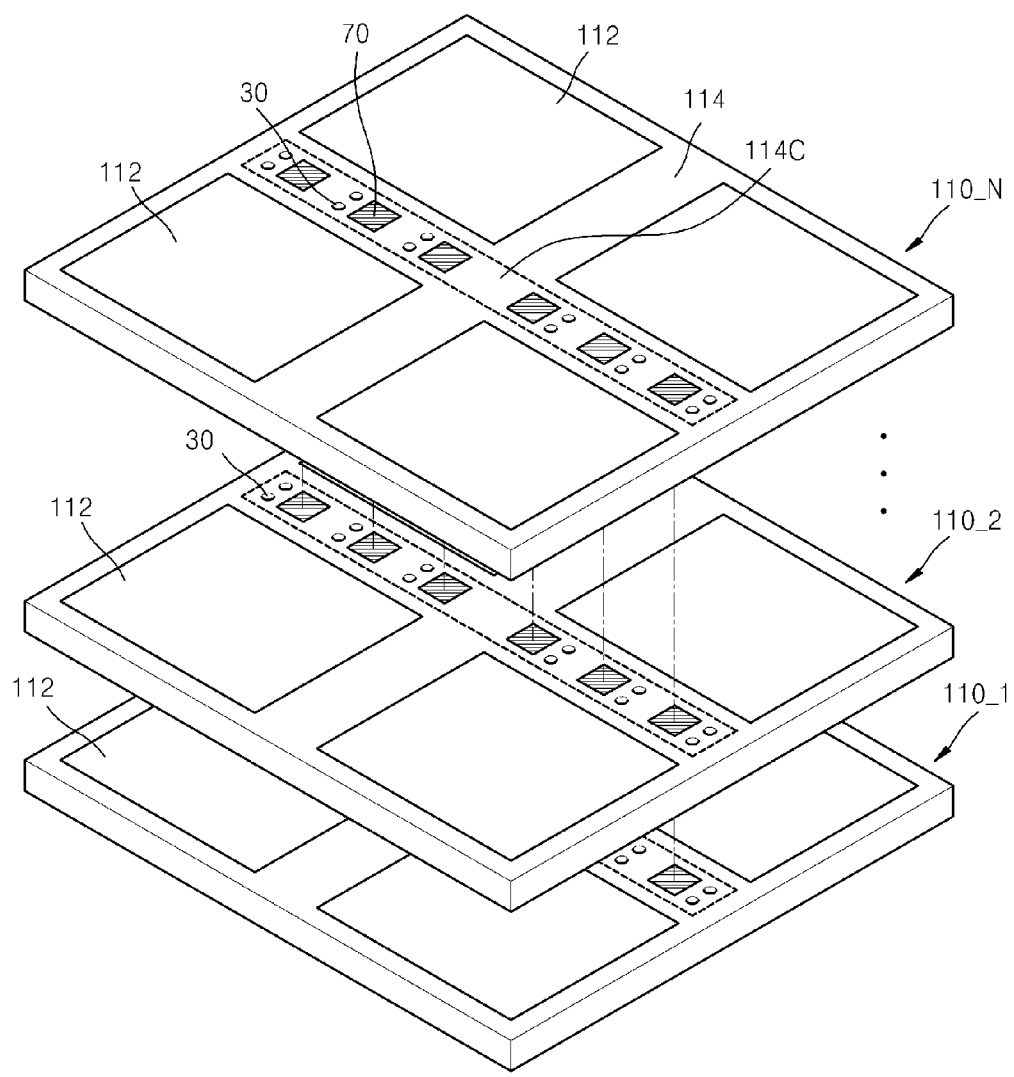
FIG. 5 is a somewhat schematic partially exploded perspective view of a 3D integrated circuit device according to an embodiment of the inventive concepts.

FIG. 5 is a somewhat schematic partially-exploded perspective view of a 3D integrated circuit device 100 according to an embodiment of the inventive concepts. The same reference numerals denote the same elements, and thus redundant descriptions thereof are omitted.

Referring to FIG. 5, the 3D integrated circuit device 100 includes a plurality of semiconductor devices 110_1, 110_2, . . . , 110_N having a stacked structure in which the semiconductor devices 110_1, 110_2, . . . , 110_N are connected to each other through a plurality of TSV structures 30.

Each of the semiconductor devices 110_1, 110_2, . . . , 110_N includes a plurality of circuit blocks 112 and a peripheral circuit region 114. The 3D integrated circuit device 100 may be a semiconductor memory device including memory cells. In such a case, the semiconductor devices 110_1, 110_2, . . . , 110_N may be configured as cell layers, and the circuit blocks 112 may be configured as memory blocks.

A TSV region 114C in which the TSV structures 30 are disposed may be provided in a center portion of the peripheral circuit region 114. The TSV structures 30 and the decoupling capacitors 70 connected to the TSV structures 30 may be disposed in the TSV region 114C. The decoupling capacitors 70 may be disposed in KOZs (see FIG. 1) around the TSV structures 30 and may filter short current impulses transferred through the TSV structures 30. Thus, reliability of the TSV structures 30 may be improved, and various circuit problems in the 3D integrated circuit device 100 can be substantially prevented. For instance, problems caused by high speed switching, due to a switching noise generated in a ground surface and a power end, and an irregular signal change in an internal circuit may be substantially prevented.

Figure 6A:
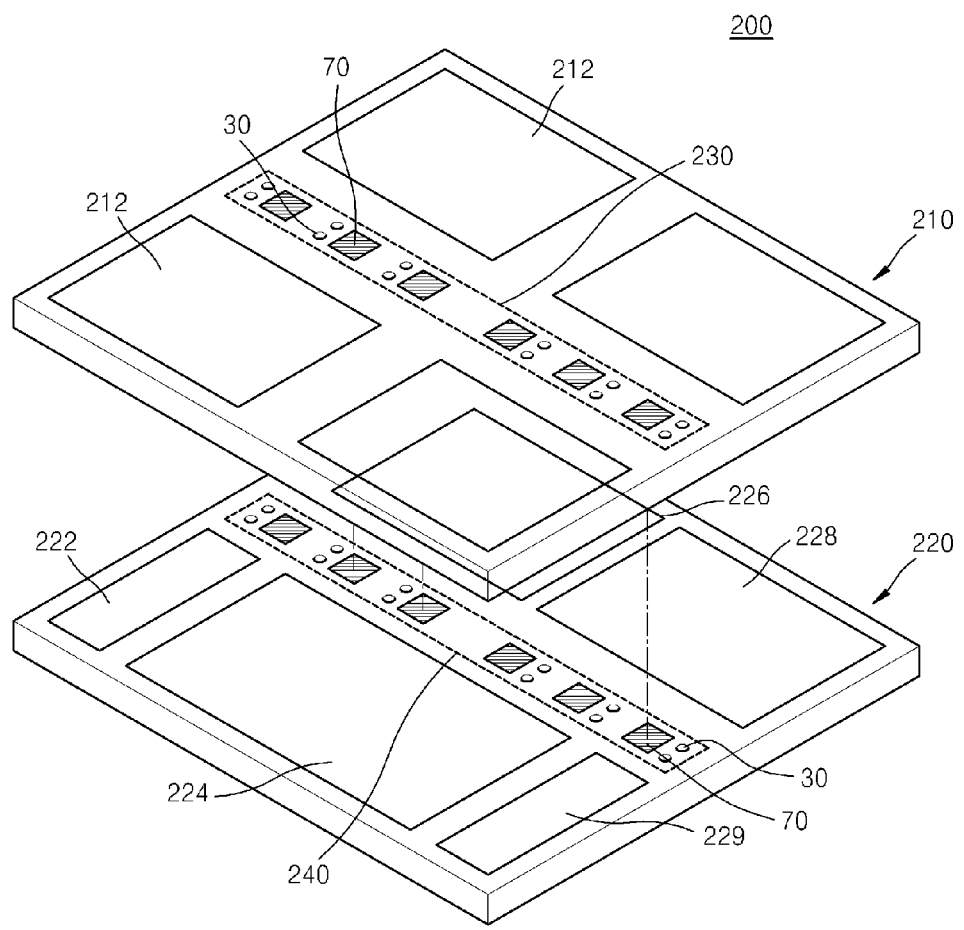
FIG. 6A is a somewhat schematic partially exploded perspective view of a 3D integrated circuit device according to another embodiment of the inventive concepts.

FIG. 6A is a somewhat schematic partially-exploded perspective view of a 3D integrated circuit device 200 according to another embodiment of the inventive concepts. The same reference numerals denote the same elements, and redundant descriptions thereof are therefore omitted.

Referring to FIG. 6A, the 3D integrated circuit device 200 may include a memory chip 210 and an interface chip 220 that are stacked in upper and lower portions, and which are connected to each other through the TSV structures 30. In some embodiments, the memory chip 210 may be a dynamic random access memory (DRAM) chip.

The interface chip 220 may include an address buffer 222 for receiving an address from the outside and for buffering the address, a command buffer 224 for receiving a command from the outside and for buffering and decoding the command, a data input and output buffer 226 for inputting and outputting data, a voltage generating unit 228 for generating a necessary power voltage, and a peripheral circuit 229 including logic for controlling general operations of the interface chip 220.

Figure 6B:
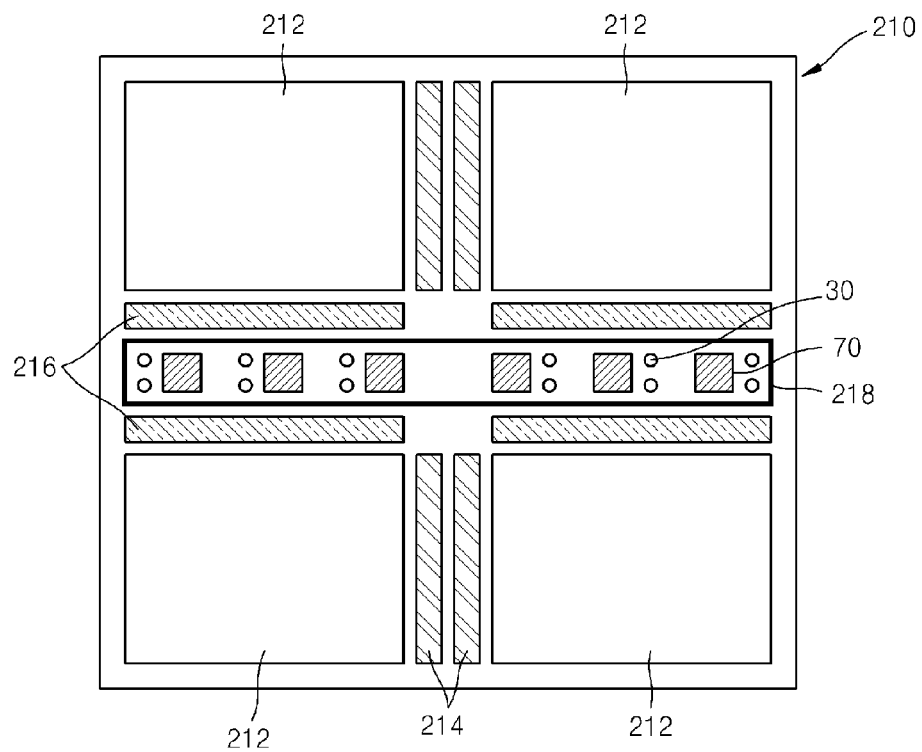
FIG. 6B is a somewhat schematic plan view illustrating a memory chip of the 3D integrated circuit device of FIG. 6A.

FIG. 6B is a somewhat schematic plan view of the memory chip 210 of FIG. 6A.

The memory chip 210 may include a plurality of memory blocks 212. A plurality of memory cells may be disposed in the memory blocks 212. A plurality of word lines, a plurality of bit lines, a sense amplifier, etc., may be disposed in the memory blocks 212 in various ways. A plurality of column decoders 214, a plurality of row decoders 216, and a TSV region 218 may be disposed in the periphery of the memory blocks 212. The column decoders 214 may receive an input of addresses, decode the addresses, and select column lines of the memory blocks 212. The row decoders 216 may receive an input of addresses, decode the addresses, and select row addresses corresponding to the desired row lines of the memory blocks 212. The memory chip 210 may further include a write driver, an input/output sense amplifier, and an input/output buffer. The input/output buffer of the memory chip 210 may receive a signal from or transmit a signal to the interface chip 220 through the TSV structure 30.

The interface chip 220 may include the input/output buffer.

A plurality of TSV structures 30 may be disposed in TSV regions 230 and 240 provided in a center portion of each of the memory chip 210 and the interface chip 220. The TSV structures 30 and the decoupling capacitors 70 connected to the TSV structures 30 may be disposed in the TSV regions 230 and 240. The decoupling capacitors 70 may be disposed in KOZs (see FIG. 1) around the TSV structures 30 and may filter short current impulses transferred through the TSV structures 30. Thus, reliability of the TSV structures 30 may be improved, and problems due to switching noise generated in a ground surface and a power end as a result of high speed switching performed in the 3D integrated circuit device 200, and irregular signal changes in an internal circuit may be substantially prevented.

Although one memory chip 210 is shown stacked on the interface chip 220 in the 3D integrated circuit device 200, the inventive concepts are not limited thereto. For example, a plurality of memory chips 210 may be vertically stacked and may be connected to each other through the TSV structures 30.

Although the interface chip 220 is shown disposed in a lowermost portion of a plurality of layers of the 3D integrated circuit device 200 having the stack structure shown in FIG. 6A, the inventive concepts are not limited thereto. For example, the interface chip 220 may be disposed in an uppermost portion of the layers of the 3D integrated circuit device 200 or may be disposed in a middle or other desired layer between the plurality of memory chips 210. Although the interface chip 220 is configured as a part of the 3D integrated circuit device 200 in FIG. 6A, the interface chip 220 may be implemented as a separate package, external to the 3D integrated circuit device 200.

Figure 7:
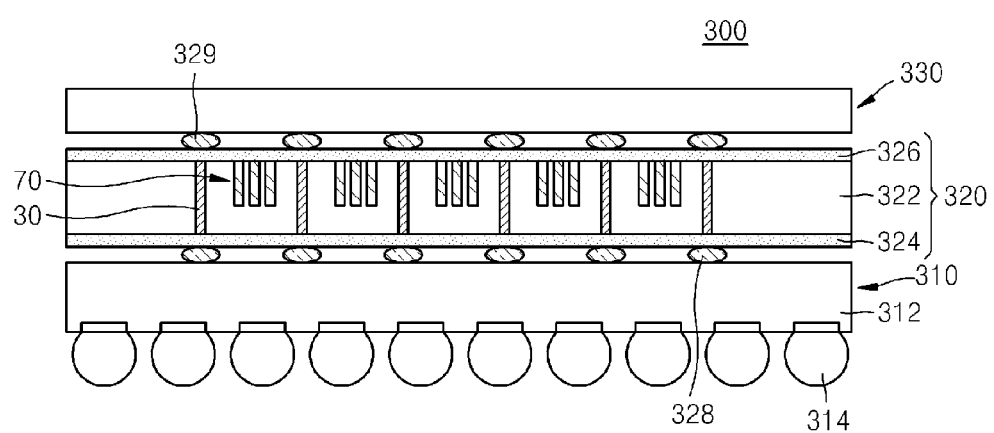
FIG. 7 is a somewhat schematic cross-sectional view of an integrated circuit device according to another embodiment of the inventive concepts.

FIG. 7 is a somewhat schematic cross-sectional view of an integrated circuit device 300 according to another embodiment of the inventive concepts. In FIG. 7, the integrated circuit device 300 is configured as a package on package (POP) device in which an upper semiconductor package 330 and a lower semiconductor package 310 are flip-chip bonded to an interposer 320 employing the TSV structures 30. The same reference numerals denote the same elements, and redundant descriptions thereof are omitted.

Referring to FIG. 7, the integrated circuit device 300 includes the lower semiconductor package 310, the interposer 320 including the TSV structures 30, and the upper semiconductor package 330.

A plurality of first connection terminals 314 may be attached to a lower portion of a substrate 312 of the lower semiconductor package 310. The first connection terminals 314 may be used to connect the integrated circuit device 300 to a main printed circuit board (PCB) of an electronic apparatus. In some embodiments, the first connection terminals 314 may include solder balls or solder lands.

The interposer 320 may be used to implement a vertical connection terminal for connecting the lower semiconductor package 310 and the upper semiconductor package 330 to each other in a fine pitch type, and may reduce a flat area of the POP integrated circuit device 300. The interposer 320 may include a silicon layer 322 through which the TSV structures 30 pass, and redistribution layers 324 and 326 that are formed in bottom and top surfaces of the silicon layer 322 to rewire the TSV structures 30. In some embodiments, at least one of the redistribution layers 324 and 326 may be omitted.

The interposer 320 may further include the decoupling capacitors 70 connected to the TSV structures 30. The decoupling capacitors 70 may be disposed in KOZs (see FIG. 1) around the TSV structures 30 and may filter short current impulses transferred through the TSV structures 30. Thus, reliability of the TSV structures 30 may be improved, and problems resulting from high speed switching performed in the integrated circuit device 300 due to a switching noise generated in a ground surface and a power end, and irregular signal changes in an internal circuit of the integrated circuit device 300 may be substantially prevented.

A plurality of second connection terminals 328 for connecting the TSV structures 30 and the substrate 312 of the lower semiconductor package 310 may be formed on a bottom surface of the interposer 320. A plurality of third connection terminals 329 for connecting the TSV structures 30 and the upper semiconductor package 330 may be formed on a top surface of the interposer 320. In some embodiments, each of the second connection terminals 328 and the third connection terminals 329 may, for example, include solder bumps or solder lands.

When the integrated circuit device 300 is a semiconductor device used in a mobile phone, for instance, the lower semiconductor package 310 may be a logic device such as a processor, and the upper semiconductor package 330 may be a memory device.

In some embodiments, the upper semiconductor package 330 may be a multichip package in which a plurality of semiconductor chips (not shown) are stacked, and an upper portion thereof may be sealed using a sealing material (not shown) to protect the semiconductor chips.

Figure 8:
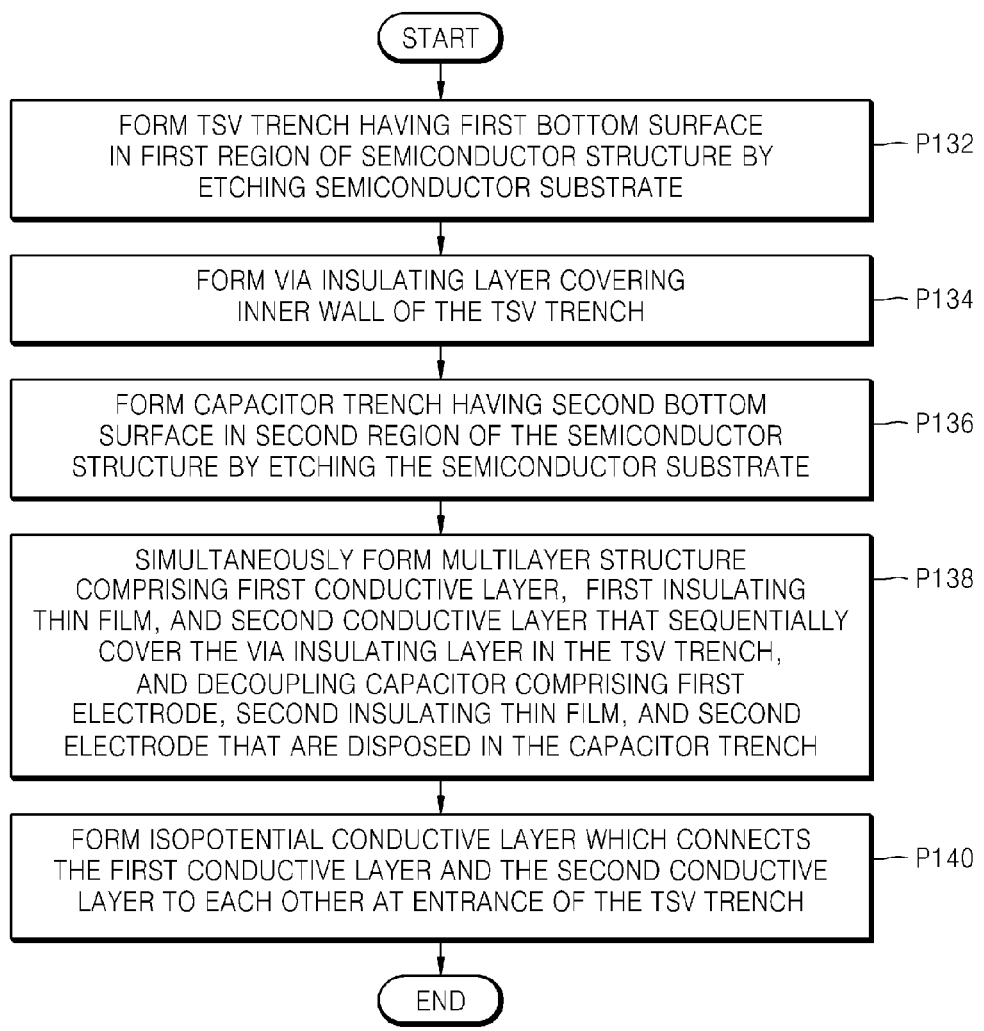
FIG. 8 is a flowchart illustrating steps of a method of manufacturing an integrated circuit device according to an embodiment of the inventive concepts.

FIG. 8 is a flowchart illustrating steps of a method of manufacturing an integrated circuit device according to an embodiment of the inventive concepts. Redundant descriptions of the elements described previously are omitted here.

Referring to FIGS. 1 and 8, in one step P132, a TSV trench having a first level bottom surface is formed by etching a semiconductor substrate in a first region of the semiconductor structure 20. The TSV trench is a preliminary structure for obtaining the via hole 22 of FIG. 1. The via hole 22 may be obtained from the TSV trench.

In another step P134, the via insulating layer 40 covering an inner wall of the TSV trench is formed. A low temperature CVD process or a plasma enhanced CVD (PECVD) process may be performed to form the via insulating layer 40.

In a further step P136, at least one capacitor trench 80 having a second bottom surface is formed in a second region of the semiconductor structure 20 by etching the semiconductor substrate.

The second region may be disposed in a KOZ within a predetermined distance from the TSV trench. In some embodiments, a plurality of capacitor trenches 80 may be formed. The capacitor trenches 80 may have bottom surfaces arranged at different levels, as illustrated for example with respect to the plurality of trenches 80Q1, 80Q2, and 80Q3 of FIG. 3 and the plurality of trenches 80R1, 80R2, and 80R3 of FIG. 4.

In an additional step P138, a multilayer structure may be formed including a first conductive layer, a first insulating thin film, and a second conductive layer spaced apart from the first conducive layer. The second conductive layer may cover the via insulating layer 40 in the TSV trench and the decoupling capacitors 70A, 70B, and 70V. Each decoupling capacitor may include a first electrode 72, a second insulating thin film 76, and a second electrode 74 disposed in the capacitor trenches 80.

In the multilayer structure, the first conductive layer, the first insulating thin film, and the second conductive layer may correspond to the first conductive barrier layer 34, first insulating thin film 36, and the second conductive barrier layer 32B, respectively, of FIG. 1. Alternatively, the second conductive layer may correspond to the conductive plug 32 including the metal plug 32A and the second conductive barrier layer 32B of FIG. 1.

In a step P140, an isopotential conductive layer is formed to connect the first conductive layer and the second conductive layer to each other near an entrance of the TSV trench. The isopotential conductive layer may, for instance, include the first conductive layer 52 and the second conductive layer 54 of FIG. 1.

FIG. 9 is a flowchart illustrating various steps in a method of manufacturing an integrated circuit device according to another embodiment of the inventive concepts. Redundant descriptions of the previously-described elements are omitted.

Referring to FIGS. 1 and 9, in step P152, a TSV trench is formed by etching the semiconductor substrate in the semiconductor structure 20. The TSV trench is a preliminary structure for obtaining the via hole 22 of FIG. 1. The via hole 22 may be obtained from the TSV trench.

In step P154, the via insulating layer 40 covering an inner wall of the TSV trench is formed.

In step P156, at least one capacitor trench 80 is formed by etching the semiconductor substrate in a location spaced apart from the TSV trench.

The capacitor trench 80 may be disposed in a KOZ within a predetermined distance from the TSV trench. The capacitor trench 80 may include a plurality of capacitor trenches having bottom surfaces arranged at different levels.

In step P158, the first conductive barrier layer 34 covering the via insulating layer 40 in the TSV trench, and the first electrode 72 covering an exposure region of the semiconductor substrate in the capacitor trench 80 may be simultaneously formed.

In step P160, the first insulating thin layer 36 covering the first conductive barrier layer 34 in the TSV trench, and the second insulating thin film 76 covering the first electrode 72P in the capacitor trench 80 may be simultaneously formed.

In step P162, at least a part of the conductive plug 32 surrounded by the first insulating thin film 36 in the TSV trench, and at least a part of the second electrode 74 covering the second insulating thin film 76 in the capacitor trench 80 may be simultaneously formed.

In some embodiments, as shown in FIG. 1, the second electrode 74 of the capacitor trench 80 may be formed of the same material as that of the second conductive barrier layer 32B of the conductive plug 32. In this case, the second conductive barrier layer 32B and the second electrode 74 may be simultaneously formed.

In other embodiments, as shown in FIG. 2, the second electrode 74P of the capacitor trench 80 may include an internal second electrode layer 74PA that is formed of the same material as that of the metal plug 32A of the conductive plug 32, as well as an external second electrode layer 74PB that is formed of the same material as that of the second conductive barrier layer 32B. In this case, after the second conductive barrier layer 32B and the external second electrode layer 74PB are simultaneously formed, the metal plug 32A and the internal second electrode layer 74PA may be simultaneously formed.

A method of manufacturing an integrated circuit device according to another embodiment of the inventive concepts will now be described in detail using additional drawings.

Figure 10A:
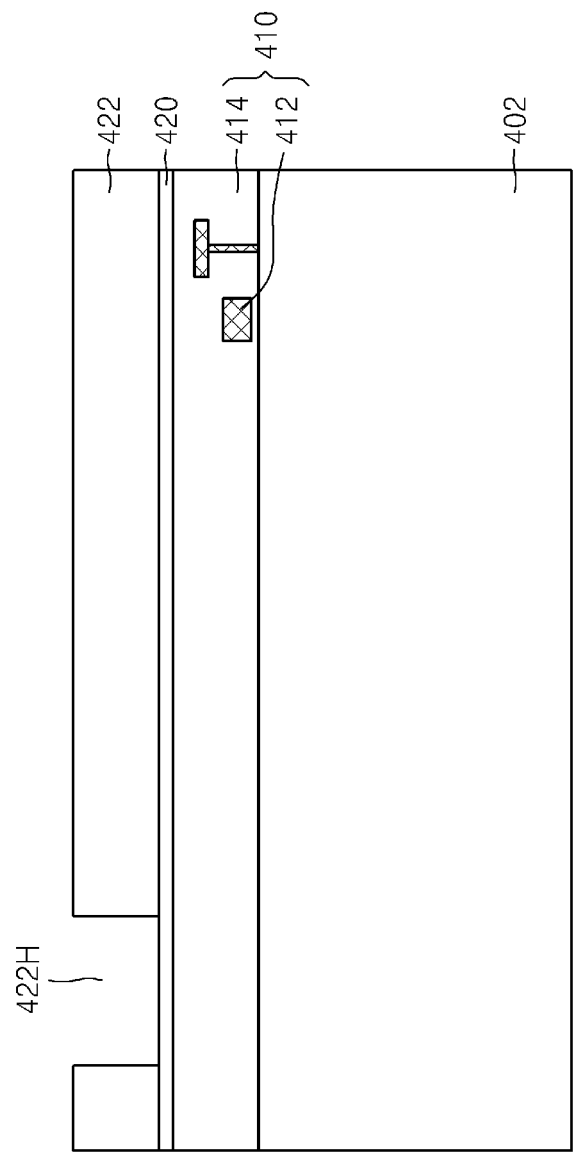
FIGS. 10A through 10O are somewhat schematic cross-sectional views of an integrated circuit device being constructed according to a method of manufacturing the integrated circuit device using principles of the inventive concepts.

FIGS. 10A through 10O are somewhat schematic cross-sectional views of a semiconductor device being constructed according to a method of manufacturing the integrated circuit device 400 according to an embodiment of the inventive concepts.

Referring to FIG. 10A, a front-end-of-line (FEOL) structure 410 may be formed on a substrate 402, a first polishing stop layer 420 may be formed on the FEOL structure 410, and a first mask pattern 422 may then be formed on the first polishing stop layer 420. A hole 422H through which a part of a top surface of the first polishing stop layer 420 is exposed may be formed in the first mask pattern 422.

In some embodiments, the substrate 402 may be a semiconductor wafer. In at least one embodiment, the substrate 402 includes silicon (Si). In other embodiments, the substrate 402 may include a semiconductor element such as germanium (Ge) or a compound semiconductor such as silicon carbide (SiC), gallium arsenide (GaAs), indium arsenide (InAs), and/or indium phosphide (InP). In at least one embodiment, the substrate 402 may have a silicon on insulator (SOI) structure. For example, the substrate 402 may include a buried oxide (BOX) layer. In some embodiments, the substrate 402 may include a conductive region, for example, a well doped with impurities or a structure doped with impurities. The substrate 402 may have various device isolation structures such as a shallow trench isolation (STI) structure.

The FEOL structure 410 may include a plurality of various types of individual devices 412 and an interlayer insulating layer 414. The individual devices 412 may include one or more of various microelectric devices, for example, a metal-oxide-semiconductor field effect transistor (MOSFET), a system large scale integration (LSI), an imaging sensor such as a CMOS imaging sensor (CIS), a micro-electro-mechanical system (MEMS), an active device, a passive device, and the like. The individual devices 412 may be electrically connected to the conductive region of the substrate 402. The individual devices 412 may be electrically separated from other adjacent devices by the interlayer insulating layer 414.

In some embodiments, the first polishing stop layer 420 may be formed of a silicon nitride layer. The first polishing stop layer 420 may have a thickness in the range of between about 200 to about 1000 Å. A CVD process may be used to form the first polishing stop layer 420.

The first mask pattern 422 may be formed of a photoresist material.

Figure 10B:
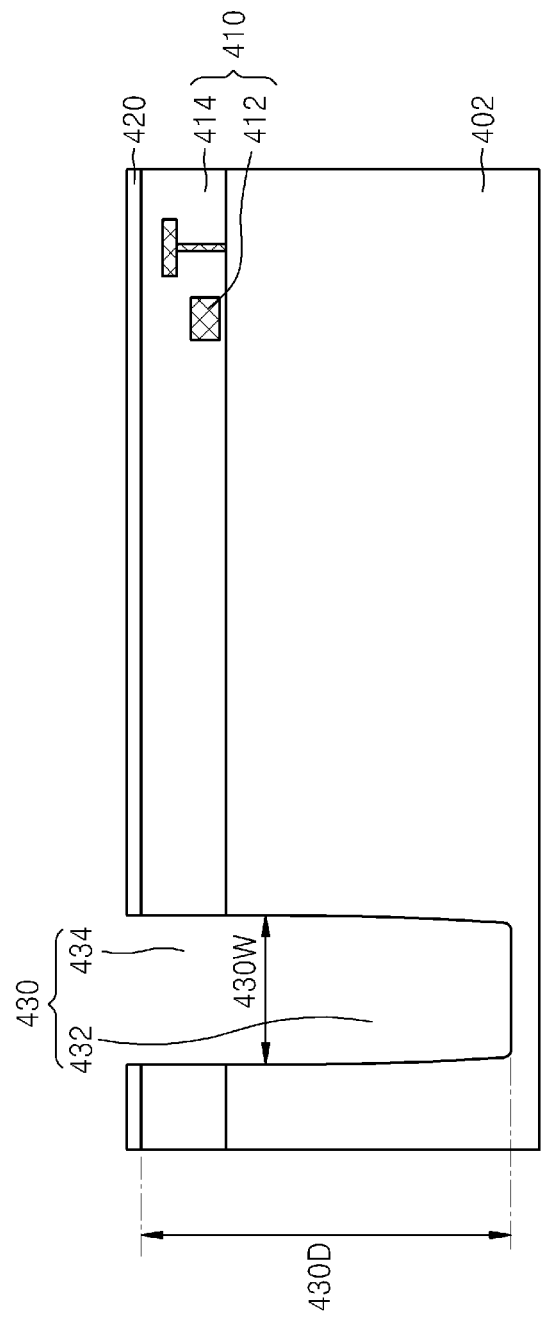

Referring to FIG. 10B, the first mask pattern 422 (see FIG. 10A) may be used as an etching mask to form a TSV trench 430 by etching the first polishing stop layer 420 and the interlayer insulating layer 414, and then etching the substrate 402. The TSV trench 430 may include a first hole 432 formed to have a predetermined depth in the substrate 402, and a second hole 434 formed to pass through the interlayer insulating layer 414 such that the second hole 434 is connected to the first hole 432.

An anisotropic etching process or a laser drilling technology may be used, for example, to form the TSV trench 430. In some embodiments, the TSV trench 430 may be formed to have a width 430W of about 10 μm or smaller in the substrate 402. In some embodiments, the TSV trench 430 may be formed to have a depth 430D in the range of between about 50 to about 100 μm from a top surface of the interlayer insulating layer 414. However, the width 430W and the depth 430D of the TSV trench 430 are not limited thereto, and may have various numerical values. The substrate 402 is exposed through the first hole 432 of the TSV trench 430. The interlayer insulating layer 414 is exposed through the second hole 434 of the TSV trench 430.

After the TSV trench 430 is formed, a top surface of the first polishing stop layer 420 may be exposed by removing the first mask pattern 422.

Figure 10C:
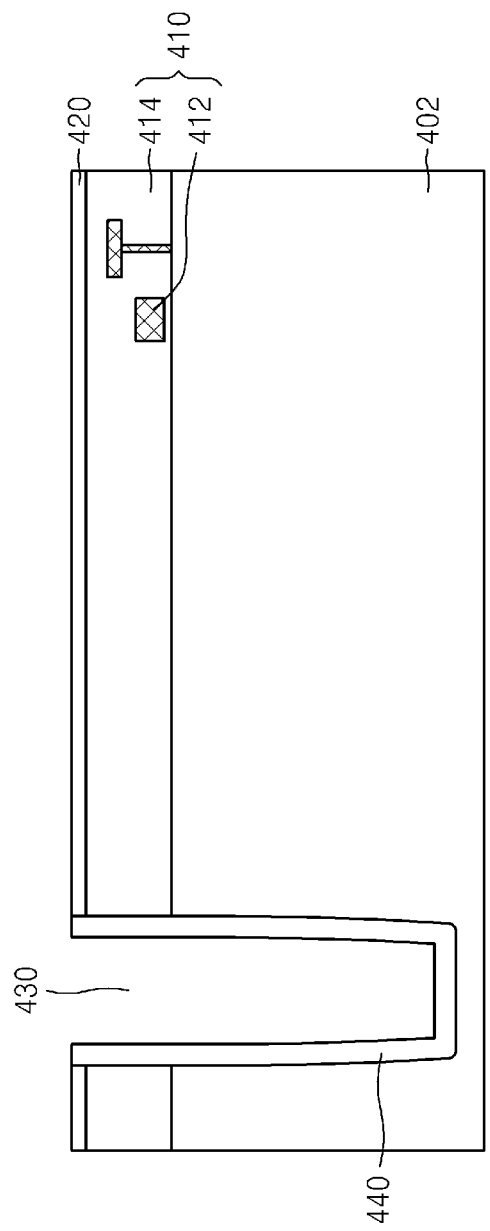

Referring to FIG. 10C, the via insulating layer 440 covering an internal side wall and a bottom surface of the TSV trench 430 may then be formed.

To form the via insulating layer 440, a preliminary via insulating layer (not shown) may be formed that covers a surface of the substrate 402, a surface of the interlayer insulating layer 414, and a surface of the first polishing stop layer 420 that are exposed in the TSV trench 430 with an approximately uniform thickness. A part of the preliminary via insulating layer disposed in an upper portion of the first polishing stop layer 420 may then be removed, leaving the via insulating layer 440 formed only in the TSV trench 430.

In some embodiments, the via insulating layer 440 may be formed of an oxide layer, a nitride layer, a carbide layer, a polymer layer, or combinations thereof. In some embodiments, a low temperature CVD process or a PECVD process may be used to form the via insulating layer 440. The via insulating layer 440 may be formed to have a thickness ranging between about 1500 to about 2500 Å.

Referring to FIG. 10D, a second mask pattern 442 that covers the inside of the TSV trench 430 and a top surface of the first polishing stop layer 420 may be formed. A plurality of capacitor trenches 450 may then be formed by etching the first polishing stop layer 420, the interlayer insulating layer 414, and the substrate 402 using the second mask pattern 442 as an etch mask.

A plurality of holes H, through which a part of the first polishing stop layer 420 is exposed may be formed in the second mask pattern 442. The holes H may have a planar structure having a plurality of line shapes arranged in parallel to each other, a planar structure having a concentric shape, or a planar structure having a spiral shape. In some embodiments, the holes H may be spaced apart from each other such that the holes H are not connected to each other. In other embodiments, at least a part of the holes H may communicate with one another. The capacitor trenches 450 may have a planar structure that corresponds to that of the holes H.

The capacitor trenches 450 may be disposed in a KOZ around the TSV trench 430.

A depth 450D of each of the capacitor trenches 450 may be smaller than the depth 430D of the TSV trench 430. Thus, a distance L1 from a rear side 402B of the substrate 402 to a bottom surface of the TSV trench 430 may be shorter than a distance L2 from the rear side 402B of the substrate 402 to a bottom surface of each of the TSV trenches 450. A width 450W of each of the capacitor trenches 450 may be smaller than the width 430W of the TSV trench 430. However, the inventive concepts are not limited thereto. For example, the width 450W of each of the capacitor trenches 450 may be designed in various ways depending on a capacitance required by the integrated circuit device 400, and may be greater than the width 430W of the TSV trench 430.

In some embodiments, the holes H formed in the second mask pattern 442 may have various widths HW. For example, some of the holes H may have different widths so that the deeper capacitor trenches 450 may be formed through the holes H having larger widths, and the shallower capacitor trenches 450 may be formed through the narrower holes H.

A reactive ion etching (RIE) process may be used to form the capacitor trenches 450. In some embodiments, while etching the substrate 402 using the second mask pattern 442 as the etch mask, in which holes H having different widths are formed, the capacitor trenches 450 may be formed having different depths according to an influence of a RIE lag. The capacitor trenches 450 formed through the holes H having smaller widths may be shallower according to the influence of the RIE lag.

Figure 10E:
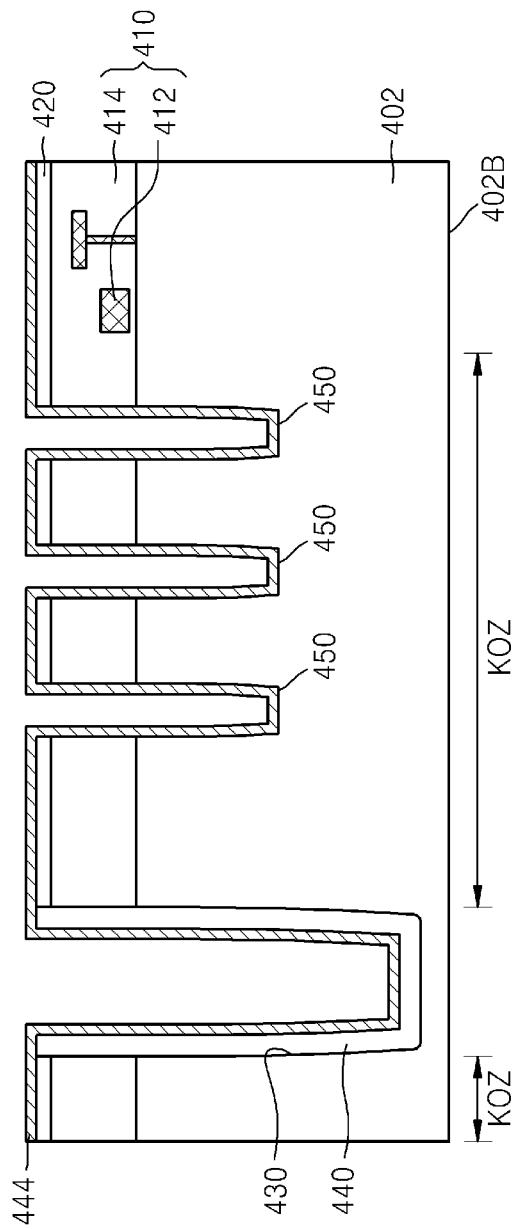

Referring to FIG. 10E, the via insulating layer 440 and the first polishing stop layer 420 may be exposed by removing the second mask pattern 442 (see FIG. 10D). A first conductive layer 444 may then be formed in the TSV trench 430, in the capacitor trenches 450, and on the first polishing stop layer 420.

The first conductive layer 444 may have a cylinder type structure in the TSV trench 430. In some embodiments, the first conductive layer 444 may be configured as a conductive layer having relatively low wiring resistance. For example, the first conductive layer 444 may have a single layer structure or a multilayer structure including at least one material selected from the group including W, WN, Ti, TiN, Ta, TaN, and Ru. For example, the first conductive layer 444 may have a multilayer structure including TaN/W, TiN/W, or WN/W. The first conductive layer 444 may have a thickness in the range of between about 50 to about 1000 Å.

As shown in FIG. 10E, the first conductive layer 444 may have an approximately uniform thickness to cover an inner side wall of each of the TSV trench 430 and the capacitor trenches 450. To this end, an ALD process or a CVD process may be used to form the first conductive layer 444.

Figure 10F:
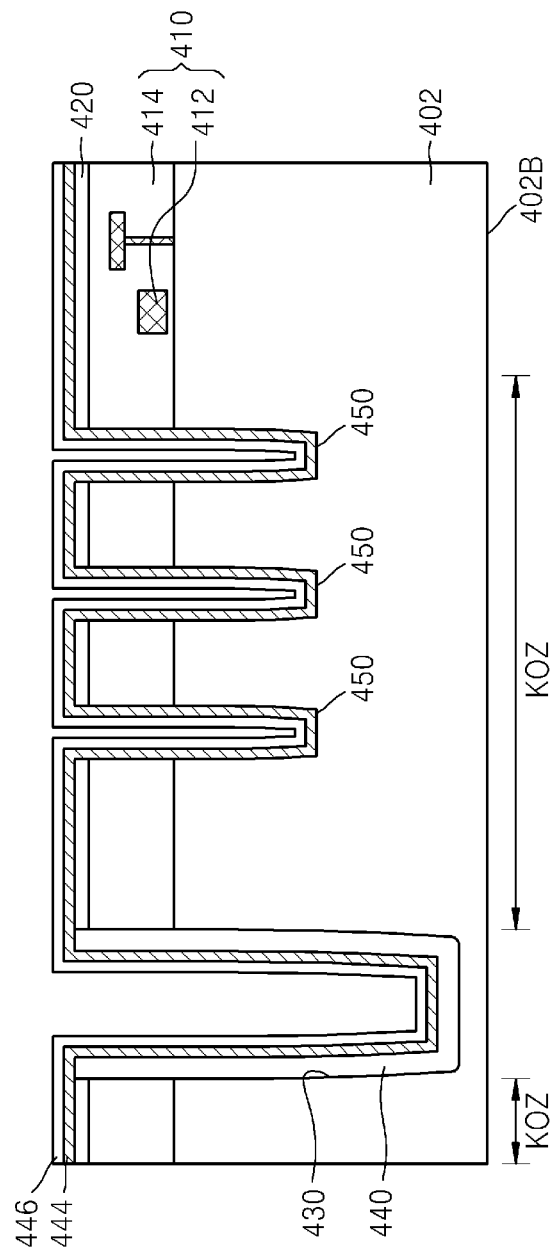

Referring to FIG. 10F, an insulating thin film 446 may be formed on the first conductive layer 444 in inner and outer portions of the TSV trench 430.

The insulating thin film 446 may be configured as a high density thin film having an approximately uniform thickness to cover the inner side wall of the TSV trench 430 and each of the capacitor trenches 450. An ALD process or a CVD process may be used to form the insulating thin film 446. The insulating thin film 446 may have a thickness ranging between about 50 to about 1000 Å.

The insulating thin film 446 may have a cylinder type structure in the TSV trench 430. The insulating thin film 446 may be formed of an oxide layer, a nitride layer, a carbide layer, a polymer layer, or combinations thereof. Various possible materials for the insulating thin film 446 are described in more detail with reference to the first insulating thin film 36 and the second insulating thin film 76 of FIG. 1.

Figure 10G:
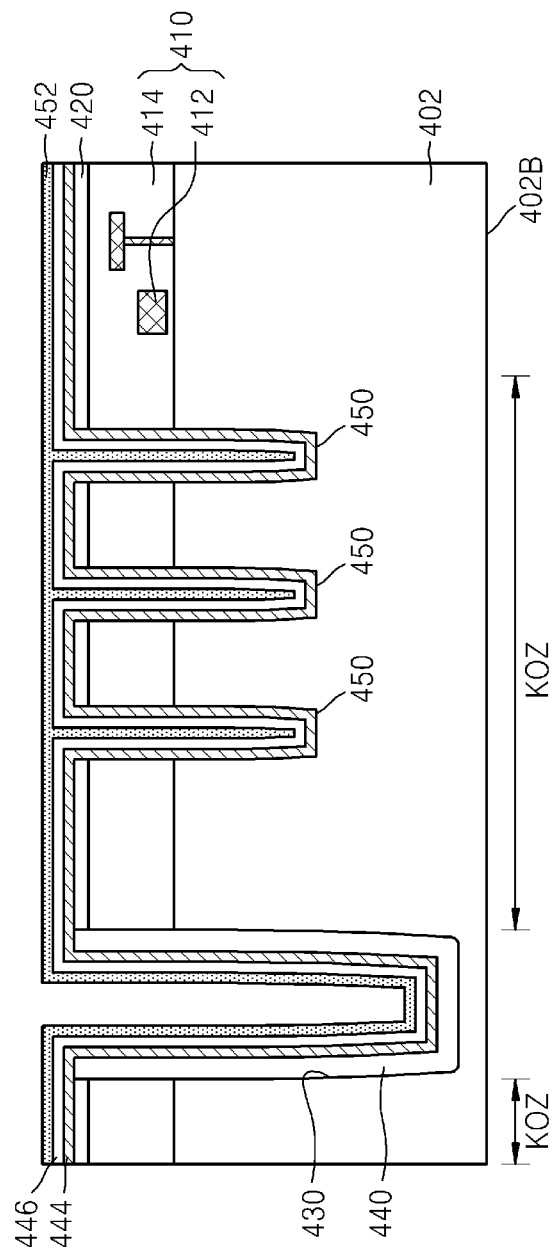

Referring to FIG. 10G, a second conductive layer 452 may be formed on the insulating thin film 446 in inner and outer portions of each of the TSV trench 430 and the capacitor trenches 450.

An ALD or CVD process may be used to form the second conductive layer 452.

Similar to the second conductive barrier layer 32B of FIG. 1, the second conductive layer 452 may be formed in the TSV trench 430 to have an approximately uniform thickness along a length of the TSV trench 430, but is not limited thereto. In some embodiments, the second conductive layer 452 may have a variable thickness along a length of the TSV trench 430. For example, a thickness of the second conductive layer 452 may become smaller from a top of the TSV trench 430 to the bottom surface of the TSV trench 430. For example, the thickness of the second conductive layer 452 may be between about 100 to about 1000 Å at the entrance of the TSV trench 430, and may be between about 0 to about 50 Å near the bottom surface of the TSV trench 430. A PVD process may be used to form the second conductive layer 452 having a variable thickness along the length of the TSV trench 430.

The second conductive layer 452 may be formed in the capacitor trenches 450 to fill a space remaining on the insulating thin film 446 up to the entrance of each of the capacitor trenches 450.

The second conducive layer 452 may have a single layer structure formed of one material or a multilayer structure formed of at least two materials. In some embodiments, the second conductive layer 452 may include at least one material selected from the group including W, WN, WC, Ti, TiN, Ta, TaN, Ru, Co, Mn, WN, Ni, and NiB.

Figure 10H:
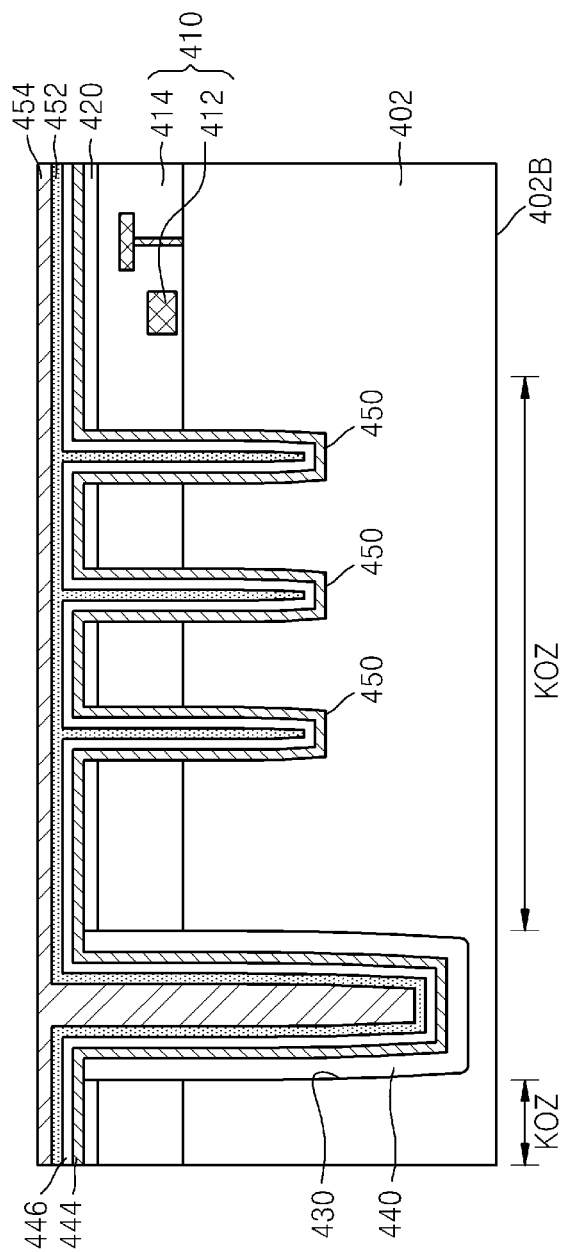

Referring to FIG. 10H, a metal layer 454 may be formed on the second conductive layer 452 to fill a remaining space of the TSV trench 430.

The metal layer 454 therefore fills the TSV trench 430. However, because the second conductive layer 452 fills each of the capacitor trenches 450 up to the entrance thereof, the metal layer 454 is not formed in the capacitor trenches 450.

In some embodiments, an electroplating process may be used to form the metal layer 454. More particularly, a metal seed layer (not shown) may be formed on a surface of the second conductive layer 452, and then a metal layer may be grown from the metal seed layer using the electroplating process. The metal layer 454 filling the TSV trench 430 can thereby be formed on the second conductive layer 452. The metal seed layer may, for instance, be formed of Cu, a Cu alloy, Co, Ni, Ru, Co/Cu, or Ru/Cu. A PVD process may be used to form the metal seed layer. A main material of the metal layer 454 may, for instance, be Cu or W. In some embodiments, the metal layer 454 may be formed of Cu, CuSn, CuMg, CuNi, CuZn, CuPd, CuAu, CuRe, CuW, W, or a W alloy, but the inventive concepts are not limited thereto. The electroplating process may be performed at a temperature between about 10 to about 65° C. For example, after the metal layer 454 is formed, a resultant structure having the metal layer 454 formed therein may be annealed at a temperature ranging between about 150 to about 450° C., as desired.

Figure 10I:
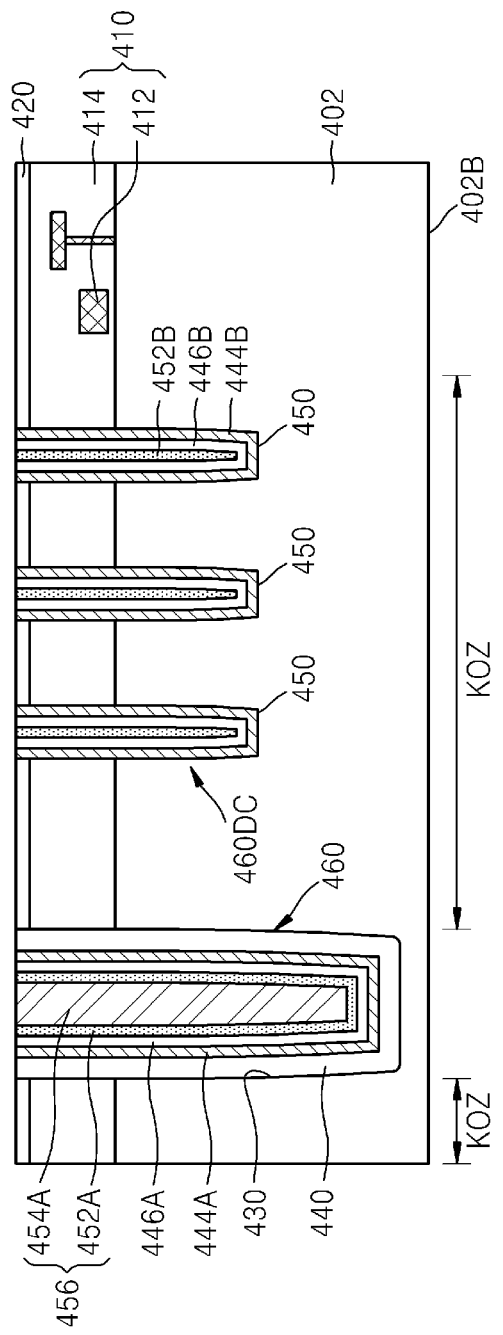

Referring to FIG. 10I, the first polishing stop layer 420 may be exposed by polishing the resultant structure, including the metal layer 454, after completing the process described with respect to FIG. 10H through a chemical mechanical polishing (CMP) process using the first polishing stop layer 420 as a stopper.

As a result, parts of the via insulating layer 40, the first conductive layer 444, the insulating thin film 446, the second conductive layer 452, and the metal layer 454 that are outside of the TSV trench 430 and the capacitor trenches 450 are removed. A TSV structure 460 is thereby formed in the TSV trench 430, and a decoupling capacitor structure 460DC is formed in each of the capacitor trenches 450.

The TSV structure 460 includes a conductive plug 456 including a metal plug 454A that is a part of the metal layer 454 and a second conductive barrier layer 452A that is a part of the second conductive layer 452, a first insulating thin film 446A that is a part of the insulating thin film 446, and a first conductive barrier layer 444A that is a part of the first conductive layer 444. The first conductive barrier layer 444A has a shape surrounding the conductive plug 456 in a location spaced apart from the conductive plug 456. The first insulating thin film 446A is disposed between the conductive plug 456 and the first conductive barrier layer 444A.

Each of the decoupling capacitors 460DC includes a first electrode 444B that is another part of the first conductive layer 444, a second insulating thin film 446B that is another part of the insulating thin film 446, and a second electrode 452B that is another part of the second conductive layer 452.

Figure 10J:
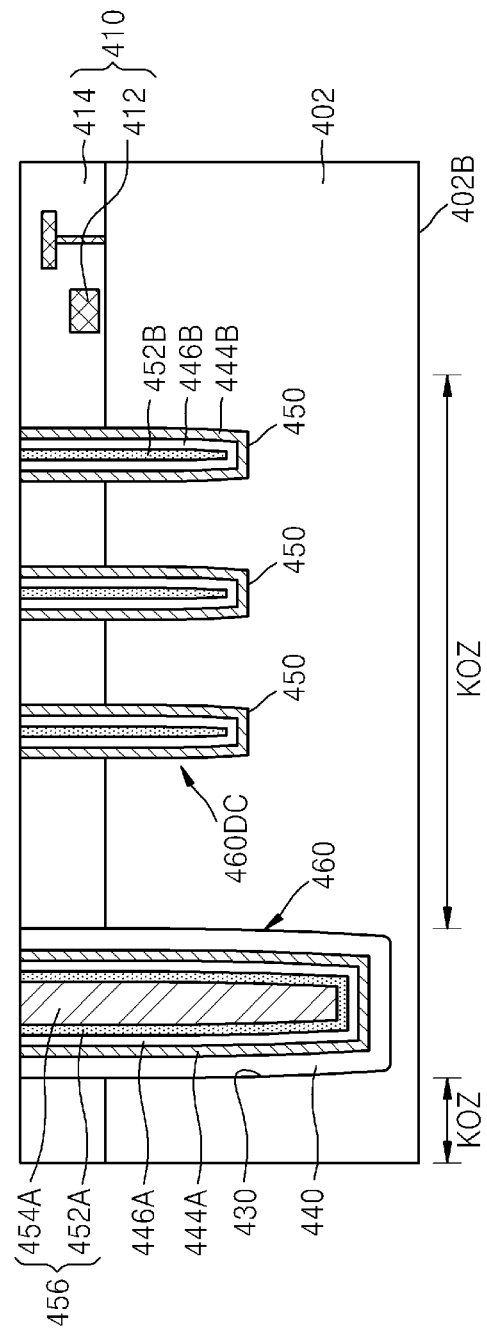

Referring to FIG. 10J, a resultant structure having the TSV structure 460 and the decoupling capacitors 460DC of FIG. 10I may be thermally treated. As a result, metal particles included in the metal plug 454A are grown by the thermal treatment, and the roughness of an exposed surface of the metal plug 454A may be reduced. Some of the metal particles grown by the thermal treatment that protrude toward the outside of the TSV trench 430 may be removed through the CMP process. In this regard, the first polishing stop layer 420 (see FIG. 10I) may be removed to expose a top surface of the interlayer insulating layer 414 of the FEOL structure 410. The thermal treatment may, for example, be performed at a temperature of between about 400 to about 500° C.

Figure 10K:
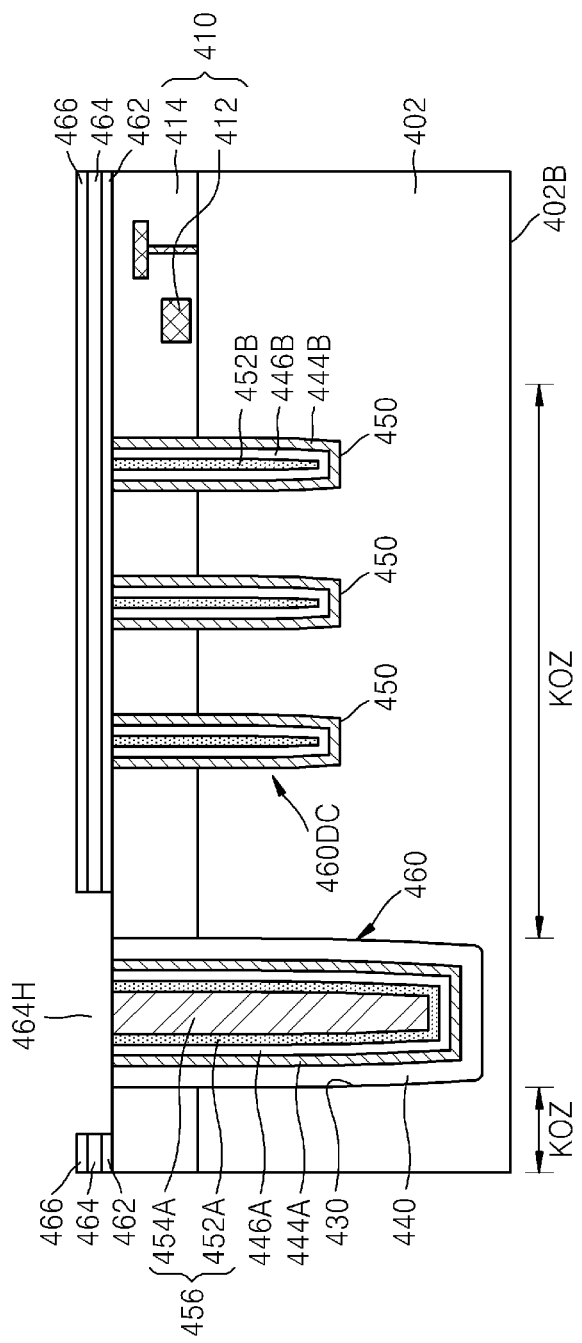

Referring to FIG. 10K, the resultant structure shown in FIG. 10H, including the TSV structure 460, may be cleaned. A wiring hole 464H through which a top surface of the TSV structure 460 and a periphery thereof are exposed may be formed at the entrance of the TSV trench 30 by sequentially forming and patterning a second polishing stop layer 462, a metal interlayer insulating layer 464, and a third polishing stop layer 466 on the interlayer insulating layer 414.

The second polishing stop layer 462 may be used as an etch stopper when the wiring hole 464H is formed.

The TSV structure 460, the via insulating layer 440 surrounding an external side wall of the TSV structure 460, and a part of the interlayer insulating layer 414 may be exposed through the wiring hole 464H. In some embodiments, the wiring hole 464H may be formed such that only the top surface of the TSV structure 460 is exposed through the wiring hole 464H.

In some embodiments, the metal interlayer insulating layer 464 may be formed of tetra-ethyl-ortho-silicate (TEOS). The second polishing stop layer 462 and the third polishing stop layer 466 may be formed of a silicon oxynitride layer. However, the materials for each of the second polishing stop layer 462, the metal interlayer insulating layer 464, and the third polishing stop layer 466 are not limited thereto. A thickness of each of the second polishing stop layer 462, the metal interlayer insulating layer 464, and the third polishing stop layer 466 may be modified as desired.

Referring to FIG. 10L, an isopotential conductive layer 472 may be formed in the wiring hole 464H (see FIG. 10K).

The isopotential conductive layer 472 may have a structure in which a barrier layer 472A and a wiring layer 472B are sequentially stacked.

In some embodiments, to form the isopotential conductive layer 472, a first layer for forming the bather layer 472A and a second layer for forming the wiring layer 472B are sequentially formed in the wiring hole 464H and on the third polishing stop layer 466 (see FIG. 10K). A top surface of the metal interlayer insulating layer 464 may then be exposed by polishing the resultant structure through a CPM process using the third polishing stop layer 466 as a stopper, and then removing the third polishing stop layer 466. As a result, the isopotential conductive layer 472, including the bather layer 472A and the wiring layer 472B, remains in the wiring hole 464H.

In some embodiments, the barrier layer 472A may include at least one material selected from the group including Ti, TiN, Ta, and TaN. In some embodiments, a PVD process may be used to form the barrier layer 472A. The bather layer 472A may have a thickness ranging between about 1000 to about 1500 Å.

In some embodiments, the wiring layer 48B may include Cu. To form the wiring layer 48B, a Cu seed layer may be formed on a surface of the barrier layer 472A, and a Cu layer may then be grown from the Cu seed layer using an electroplating process. An annealing process may be performed on the resultant structure including the Cu layer.

Figure 10M:
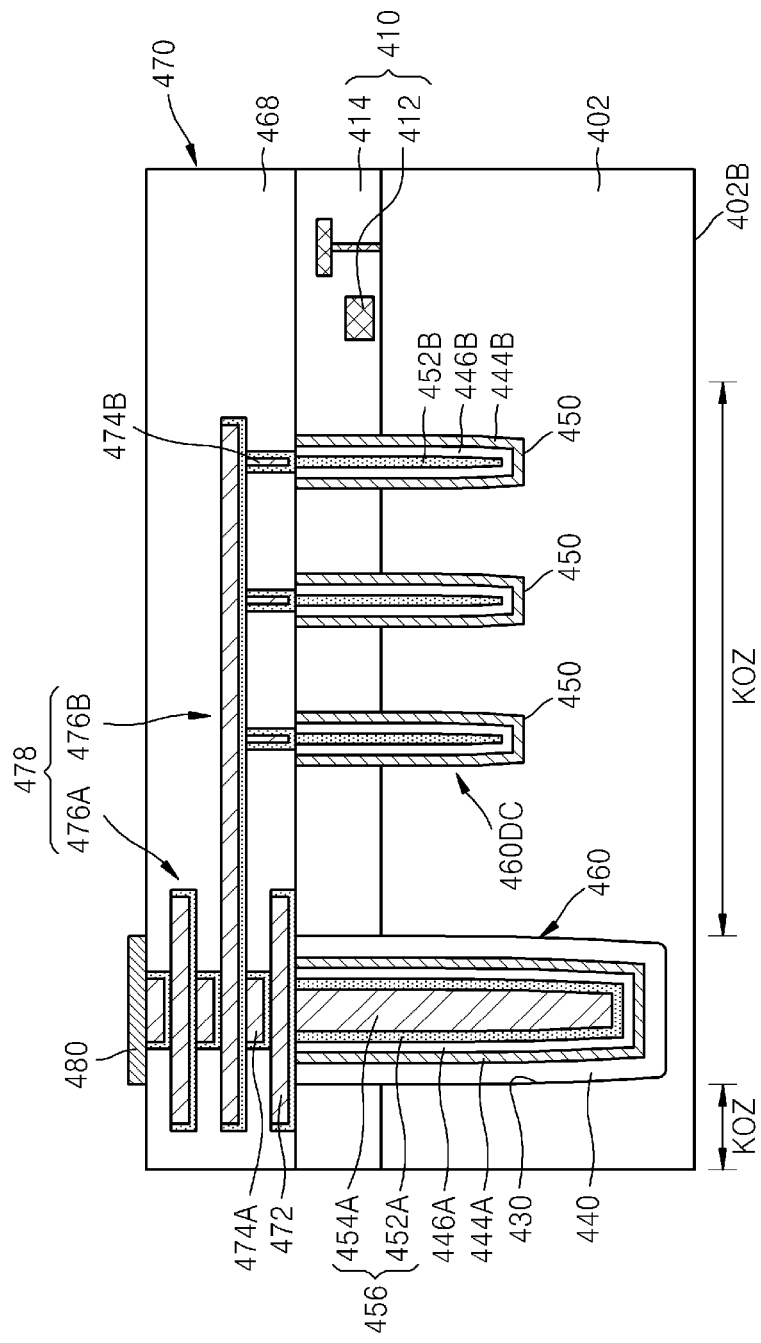
Figure 100:
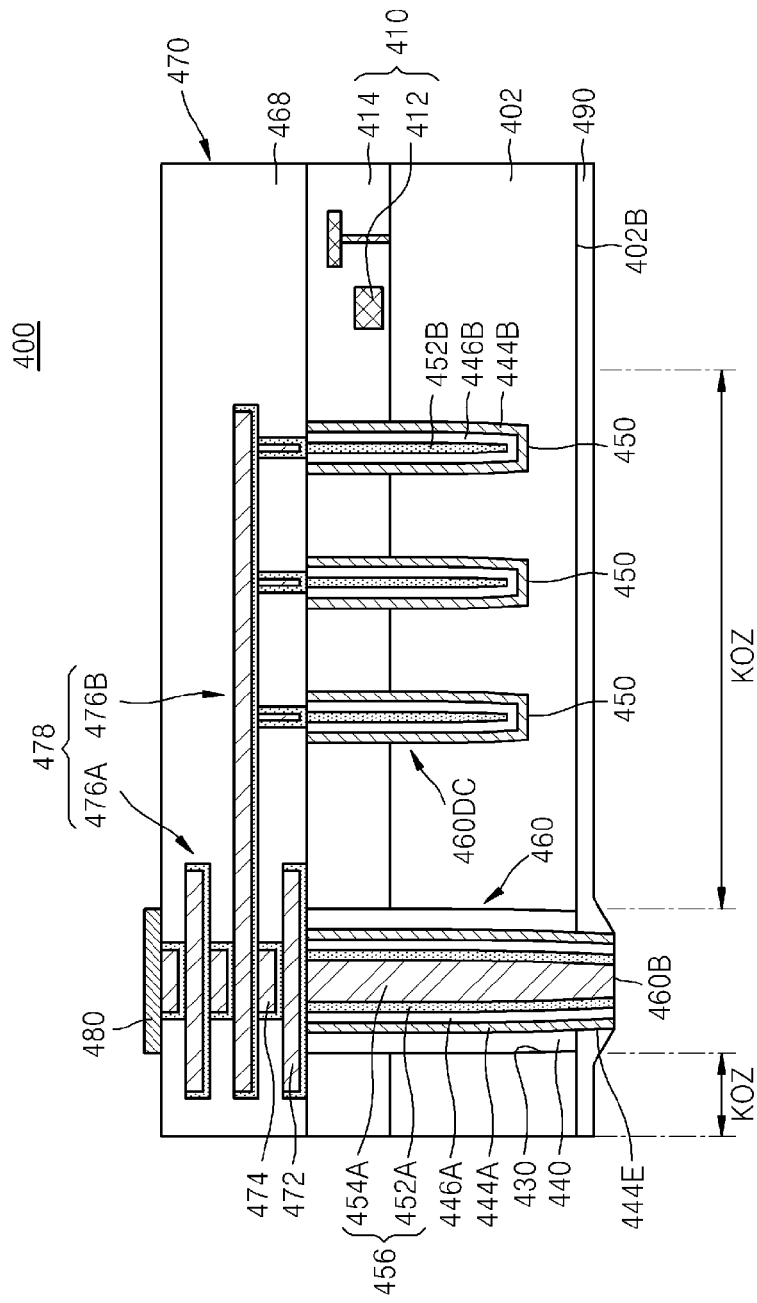

Referring to FIG. 10M, using a process similar to that of forming the isopotential conductive layer 472 described with reference to FIGS. 10K and 10L, a contact plug 474A connected to the isopotential conductive layer 472 and a contact plug 474B connected to the second electrode 452B of the decoupling capacitors 460DC may be formed. The contact plugs 474A and 474B may have the same stack structure but are not limited thereto.

The contact plug 474A connected to the isopotential conductive layer 472 and the contact plug 474B connected to the second electrode 452B of the decoupling capacitors 460DC may be formed simultaneously or separately.

Thereafter, a multilayer wiring structure 478 including a plurality of metal wiring layers and a plurality of contact plugs may be formed by repeatedly performing a process similar to that of forming the isopotential conductive layer 472 described with reference to FIGS. 10K and 10L, and that of forming the contact plug 474A. The multilayer wiring structure 478 may include a first wiring structure 476A connected to the TSV structure 460 and a second wiring structure 476B connected to the decoupling capacitors 460DC.

In some embodiments, during formation of the multilayer wiring structure 478, other multilayer wiring structures including a plurality of metal wiring layers and a plurality of contact plugs may be formed on another region of the substrate 402. As a result, a metal interlayer insulating layer structure 468 in which a stack structure similar to that of the second polishing stop layer 462 and the metal interlayer insulating layer 464 of FIG. 10L may be repeatedly formed, and a back-end-of-line (BEOL) structure 470 including a plurality of multilayer wiring structures having portions insulated by the metal interlayer insulating layer structure 468 can be obtained. The BEOL structure 470 may be formed to include a plurality of wiring structures for connecting the individual devices included in the FEOL structure 410 to other wirings. In some embodiments, the BEOL structure 470 may further include a seal ring for protecting the wiring structures and other structures thereunder from external shock or moisture.

The TSV structure 460 and the decoupling capacitors 460DC may be connected to each other via the isopotential conductive layer 472 and the multilayer wiring structure 478. To connect the TSV structure 460 and the decoupling capacitors 460DC, the first wiring structure 476A, connected to the isopotential conductive layer 472, and the second wiring structure 476B, connected to the decoupling capacitors 460DC, may be connected to each other. The second wiring structure 476B may be used to connect the decoupling capacitors 460DC to each other in parallel. The second wiring structure 476B may function to connect the parallel-connected decoupling capacitors 460DC to the TSV structure 460 via the isopotential conductive layer 472.

The multilayer wiring structure 478 is merely an example, and the wiring structure may have various shapes and structures according to a design of the integrated circuit device 400.

Thereafter, a contact pad 480 may be formed on the metal interlayer insulating layer structure 468 to be electrically connected to the multilayer wiring structure 478.

In some embodiments, each of the isopotential conductive layer 472 and the multilayer wiring structure 478 may include at least one metal selected from among W, Al, and Cu. In some embodiments, the isopotential conductive layer 472 and the multilayer wiring structure 478 may be formed of the same material. In other embodiments, at least part of each of the isopotential conductive layer 472 and the multilayer wiring structure 478 may include different materials.

In some embodiments, a plurality of other multilayer wiring patterns (not shown) may be formed in the metal interlayer insulating layer structure 468 at the same level as that of the first wiring structure 476A or the second wiring structure 476B. A plurality of other contact pads (not shown) may be formed on the metal interlayer insulating layer structure 468 at the same level as that of the contact pad 480.

Referring to FIG. 10N, a bottom surface 460B of the TSV structure 460 may be exposed by removing a predetermined thickness of the back surface 402B of the substrate 402.

As a result, a part of the first conductive barrier layer 444A and a part of the conductive plug 456 may be exposed through the bottom surface 460B of the TSV structure 460. The bottom surface 460B of the TSV structure 460 may protrude from the back surface 402B of the substrate 402.

In some embodiments, a CPM process, an etch-back process, or a combination thereof may be used to remove a part of the back surface 402B of the substrate 402.

After part of the back surface 402B of the substrate 402 is removed, the TVS trench 430 becomes a through via hole that passes through the substrate 402 and the interlayer insulating layer 414. A part of the via insulating layer 440 and a part of the TSV structure 460 may protrude from the back surface 402B of the substrate 402. After the bottom surface 460B of the TSV structure 460 is exposed, a part of a side wall of an edge 444E of the first conductive barrier layer 444A may be exposed by removing an exposed part of the via insulating layer 440 that surrounds the TSV structure 460 around the protruding part of the TSV structure 460. An isotropic or anisotropic etching process may be used to remove the exposed part of the via insulating layer 440.

Referring to FIG. 10O, formation of the integrated circuit device 400 may be completed by forming a backside insulating layer 490 covering the back surface 402B of the substrate 402 around the bottom surface 460B of the TSV structure 460.

In some embodiments, the backside insulating layer 490 may be formed by a spin coating process or a spray process. The backside insulating layer 490 may be formed of a polymer. In some embodiments, to form the backside insulating layer 490, a polymer layer covering the back surface 402B of the substrate 402 and the bottom surface 460B of the TSV structure 460 may be formed and then partially etch-backed to expose the bottom surface 460B of the TSV structure 460.

In the integrated circuit device 400 of FIG. 10O, the TSV structure 460 may include a side wall surrounded by the substrate 402 and another side wall surrounded by the interlayer insulating layer 414 of the FEOL structure 410. The substrate 402 and the FEOL structure 410 may correspond to the semiconductor structure 20 of FIG. 1. The TSV structure 460 may correspond to the TSV structure 30 of FIG. 1. The isopotential conductive layer 472 that is disposed on the interlayer insulating layer 414 and connected to the TSV structure 460 may correspond to the first conductive layer 52 of FIG. 1. The first conductive barrier layer 440A of the TSV structure 460 and an isopotential conductive layer (not shown) connected to the conductive plug 456 may be formed in the bottom surface 460B of the TSV structure 460. In some embodiments, the isopotential conductive layer (not shown) connected to the bottom surface 460B of the TSV structure 460 may correspond to the second conductive layer 54 of FIG. 1.

In the integrated circuit device 400 of FIG. 10O, although the second conductive barrier layer 452A has an approximately uniform thickness along the length of the TSV structure 30, the inventive concepts are not limited thereto. For example, the second conductive bather layer 452A may have a variable thickness along the length of the TSV structure 30.

Figure 11:
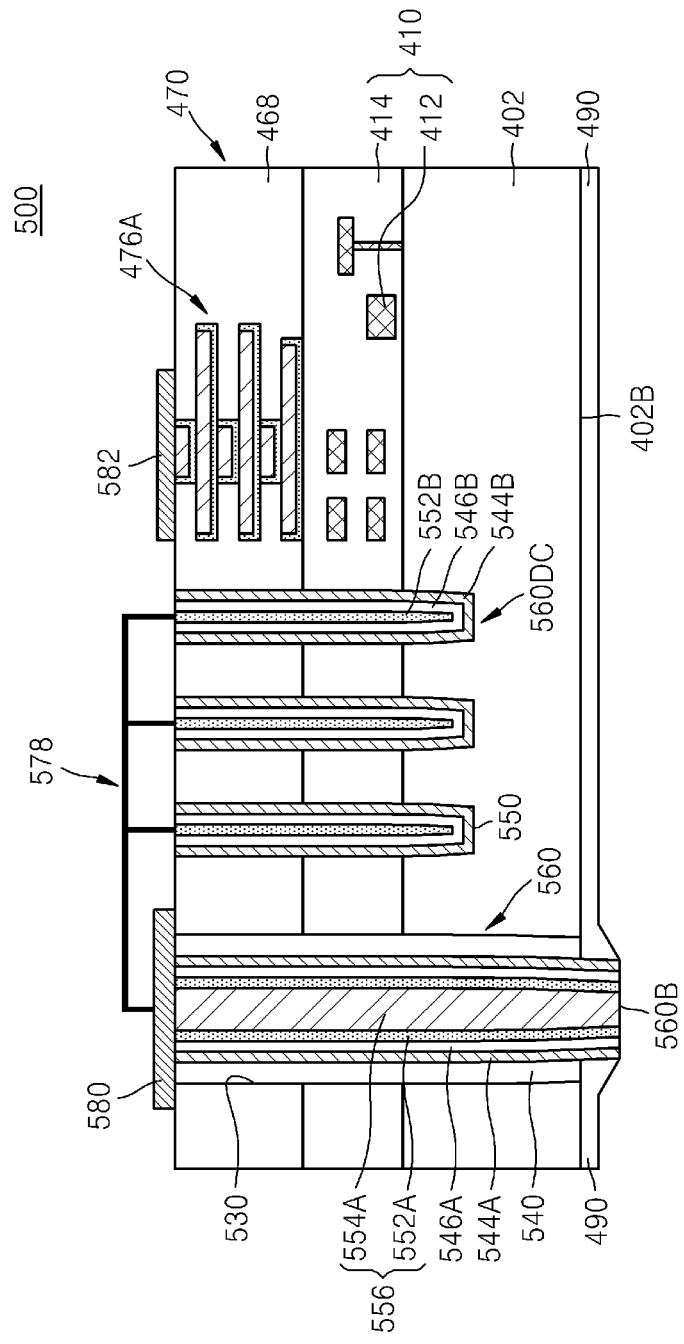
FIG. 11 is a somewhat schematic cross-sectional view of an integrated circuit device illustrating important elements of the integrated circuit device according to an embodiment of the inventive concepts.

FIG. 11 is a somewhat schematic cross-sectional view of an integrated circuit device 500 according to an embodiment of the inventive concepts. In FIG. 11, the same reference numerals denote the same elements and redundant explanations thereof will not be given.

Referring to FIG. 11, the integrated circuit device 500 includes a TSV structure 560 and a plurality of decoupling capacitors 560DC connected to the TSV structure 560.

The TSV structure 450 is formed to pass through the substrate 402, the interlayer insulating layer 414 of the FEOL structure 410, and the metal interlayer insulating structure 468 of the BEOL structure 470, with a side wall of the TSV structure 450 being surrounded by the via insulating layer 540.

The TSV structure 560 may include a conductive plug 556, a first conductive barrier layer 544A surrounded by the conductive plug 556 in a location spaced apart from the conductive plug 556, and a first insulating thin film 546A disposed between the conductive plug 556 and the first conductive barrier layer 544A. The conductive plug 556 may include the substrate 402, the interlayer insulating layer 414 of the FEOL structure 410, a second conductive barrier layer 552A passing through the metal interlayer insulating structure 468 of the BEOL structure 470, and a metal plug 554A surrounded by the second conductive barrier layer 552A. The conductive plug 556 may be spaced apart from the first conductive barrier layer 544A with the first insulating thin film 546A disposed therebetween.

The integrated circuit device 500 may include an isopotential conductive layer 580 that is connected to the conductive plug 556 and the first conductive barrier layer 544A at one end of the TSV structure 560. The isopotential conductive layer 580 functions to electrically connect the conductive plug 556 and the first conductive barrier layer 544A to each other, such that the conductive plug 556 and the first conductive barrier layer 544A are isopotential to each other.

The decoupling capacitors 560DC pass through the metal interlayer insulating structure 468 of the BEOL structure 470 and the interlayer insulating layer 414 of the FEOL structure 410 and extend into the substrate 402.

Each of the decoupling capacitors 560DC may include a first electrode 544B that is formed of the same material as that of the first conductive barrier layer 544A, a second electrode 552B that is spaced apart from the first electrode 544B and is formed of the same material as that of the second conductive barrier layer 552A of the conductive plug 556, and a second insulating thin film 546B that is disposed between the first electrode 544B and the second electrode 552B and is formed of the same material as that of the first insulating thin film 546A.

The TSV structure 560 and each of the decoupling capacitors 560DC may include a portion surrounded by the substrate 402, a portion surrounded by the interlayer insulating layer 414 of the FEOL structure 410, and a portion surrounded by the metal interlayer insulating structure 468 of the BEOL structure 470.

The decoupling capacitors 560DC may be connected to the TSV structure 450 via a wiring structure 578 and the isopotential conductive layer 580.

A series of processes may be performed to manufacture the integrated circuit device 500 including the TSV structure 560 and the decoupling capacitors 560DC, as will now be described.

The FEOL structure 410 may be formed in the same manner as described with reference to FIG. 10A. The BEOL structure 470, including the first wiring structure 476A and the metal interlayer insulating layer structure 468, may then be formed in a way similar to that described with reference to FIGS. 10K through 10M.

Thereafter, a TSV trench used to form the via hole 530 may be formed by sequentially etching the metal interlayer insulating structure 468, the interlayer insulating layer 414, and the substrate 402. The via insulating layer 540 may then be formed in the TSV trench, and a plurality of capacitor trenches 550 used to form the decoupling capacitors 560DC may then be formed.

The TSV structure 560, surrounded by the via insulating layer 450, may be formed in the TSV trench in a way similar to that described with reference to FIGS. 10A through 10J, and the decoupling capacitors 560DC may be formed in the capacitor trenches 550.

Thereafter, a contact pad 582 may be formed to be electrically connected to the first wiring structure 476A, along with the isopotential conductive layer 580 connected to the TSV structure 560, and the wiring structure 578 for connecting the decoupling capacitors 560DC to the TSV structure 560 via the isopotential conductive layer 580.

Thereafter, a bottom surface 560B of the TSV structure 560 may be exposed in the same manner as described with reference to FIGS. 10N through 10O, and the backside insulating layer 490 covering the back surface 402B of the substrate 402 may be formed.

The TSV structure 560 and the decoupling capacitors 560DC may be similar to those described with reference to the TSV structure 460 and the decoupling capacitors 460DC of FIGS. 10A through 10O.

Figure 12:
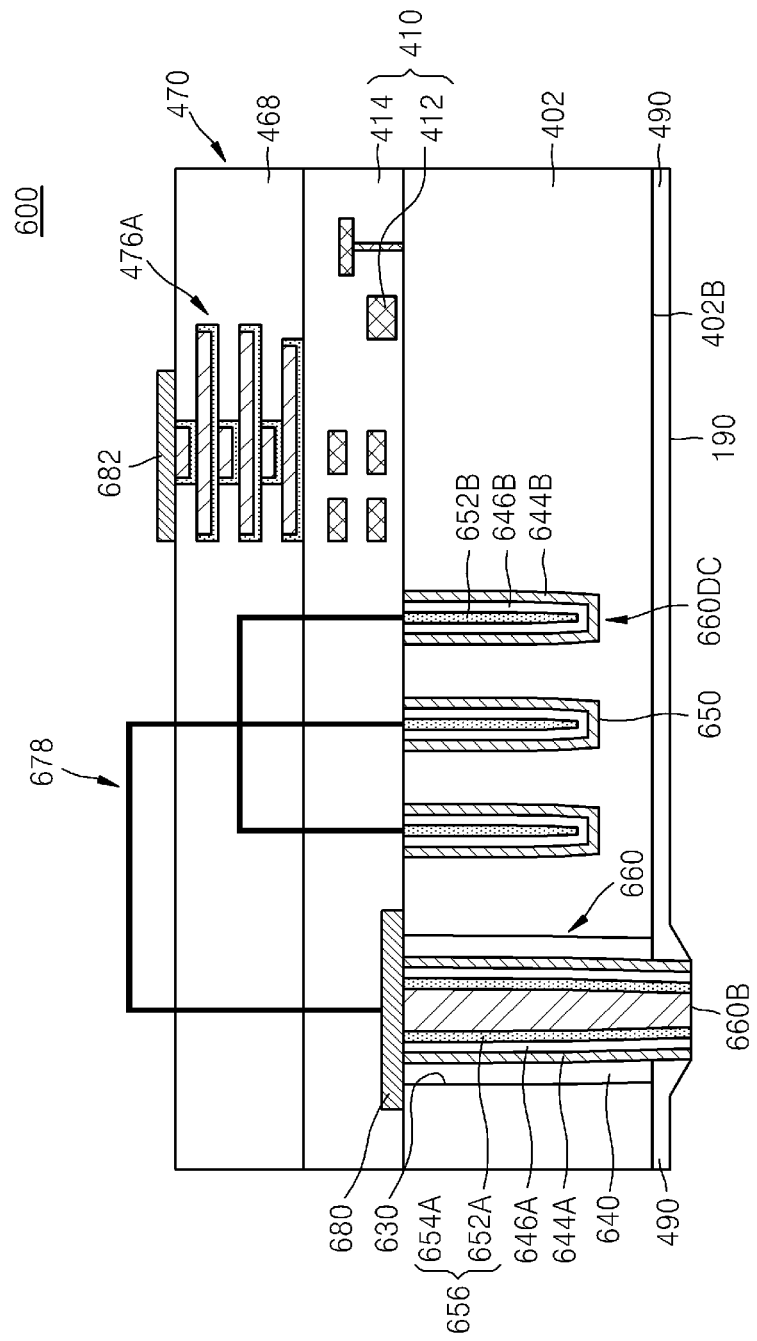
FIG. 12 is a somewhat schematic cross-sectional view of an integrated circuit device illustrating important elements of the integrated circuit device according to another embodiment of the inventive concepts.

FIG. 12 is a somewhat schematic cross-sectional view of an integrated circuit device 600 according to another embodiment of the inventive concepts. The same reference numerals denote the same elements and redundant explanations thereof will not be given.

Referring to FIG. 12, the integrated circuit device 600 may include a TSV structure 660 and a plurality of decoupling capacitors 660DC connected to the TSV structure 660.

The TSV structure 660 may be formed at a lower level than that of the FEOL structure 410. The TSV structure 660 may be formed to pass through the substrate 402 while being surrounded by a via insulating layer 640. The decoupling capacitors 660DC may be formed inside the substrate 402. TSV structure 660 and each of the decoupling capacitors 660DC may have a part surrounded by the substrate 402. The TSV structure 660 may include a conductive plug 656, a first conductive bather layer 644A surrounded by the conductive plug 656 in a location spaced apart from the conductive plug 656, and a first insulating thin film 646A disposed between the conductive plug 656 and the first conductive barrier layer 644A. The conductive plug 656 passes through the substrate 402 and may include a second conductive barrier layer 652A and a metal plug 654A surrounded by the second conductive bather layer 652A. The conductive plug 656 may be spaced apart from the first conductive barrier layer 644A with the first insulating thin film 646A disposed therebetween.

The integrated circuit device 600 may include an isopotential conductive layer 680 that is connected to the conductive plug 656 and the first conductive barrier layer 644A at one end of the TSV structure 660. The isopotential conductive layer 680 functions to electrically connect the conductive plug 656 and the first conductive barrier layer 644A to each other, such that the conductive plug 656 and the first conductive barrier layer 644A are isopotential to each other.

Each of the decoupling capacitors 660DC may include a first electrode 644B that is formed of the same material as that of the first conductive barrier layer 644A, a second electrode 652B that is spaced apart from the first electrode 644B and is formed of the same material as that of the second conductive barrier layer 652A of the conductive plug 656, and a second insulating thin film 646B that is disposed between the first electrode 644B and the second electrode 652B and is formed of the same material as that of the first insulating thin film 646A.

The decoupling capacitors 660DC may be connected to the TSV structure 660 via a wiring structure 678 and the isopotential conductive layer 680. The wiring structure 678 may be a multilayer wiring structure.

A series of processes may be performed to manufacture the integrated circuit device 600 including the TSV structure 660 and the decoupling capacitors 660DC.

Before the FEOL structure 410 is formed on the substrate 402, in a manner similar to that described with reference to FIGS. 10A through 10J, a TSV trench and the via insulating layer 640 covering an inner wall of the TSV trench are formed. A plurality of capacitor trenches 650 may also be formed. Thereafter, the TSV structure 660, substantially surrounded by the via insulating layer 640, is formed in the TSV trench, and the decoupling capacitors 660DC are formed in the capacitor trenches 650.

The FEOL structure 410 may be formed on the substrate 402 in which the TSV structure 660 and the decoupling capacitor 660DC are formed in the same manner as described previously with reference to FIG. 10A. The FEOL structure 410 includes a part of each of the wiring structure 678 and the isopotential conductive layer 680.

The BEOL structure 470, including the first wiring structure 476A and the metal interlayer insulating layer structure 468, may be formed in the same manner as described previously with reference to FIGS. 10K through 10M. In the present embodiment, the BEOL structure 470 may include a part of the wiring structure 678.

A contact pad 682, which is electrically connectable to the first wiring structure 476A, may be formed on the metal interlayer insulating layer structure 468.

Thereafter, a bottom surface 660B of the TSV structure 660 may be exposed in the same manner as described previously with reference to FIGS. 10N through 10O, and the backside insulating layer 490 covering the back surface 402B of the substrate 402 may then be formed.

The TSV structure 660 and the decoupling capacitors 660DC may be the same as the TSV structure 460 and the decoupling capacitors 460DC, respectively, of FIGS. 10A through 10O.

FIGS. 13A through 13E are somewhat schematic cross-sectional views of an integrated circuit device being manufactured using a method of manufacturing an integrated circuit device 700 according to another embodiment of the inventive concepts. In FIGS. 13A through 13E, the same reference numerals as used previously denote the same elements, and redundant explanations thereof will not be given.

Figure 13A:
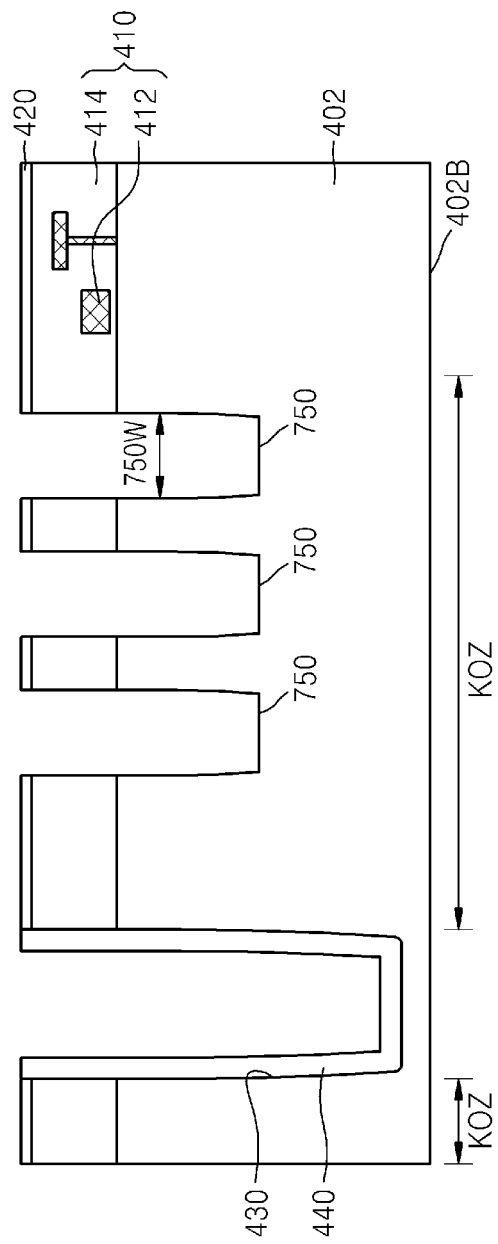

Referring to FIG. 13A, the TSV trench 430 and the via insulating layer 440 may be formed in a similar way to that described previously with reference to FIGS. 10A through 10D. A plurality of capacitor trenches 750 may also be formed in a KOZ around the TSV trench 430. The second mask pattern 442 may be removed, and the via insulating layer 440 and the first polishing stop layer 420 may be exposed.

The capacitor trenches 750 may have approximately the same configuration as that of the capacitor trenches 550 of FIG. 10D, except that a width 750W of each of the capacitor trenches 750 may be greater than the width 450W of each of the capacitor trenches 550.

Figure 13B:
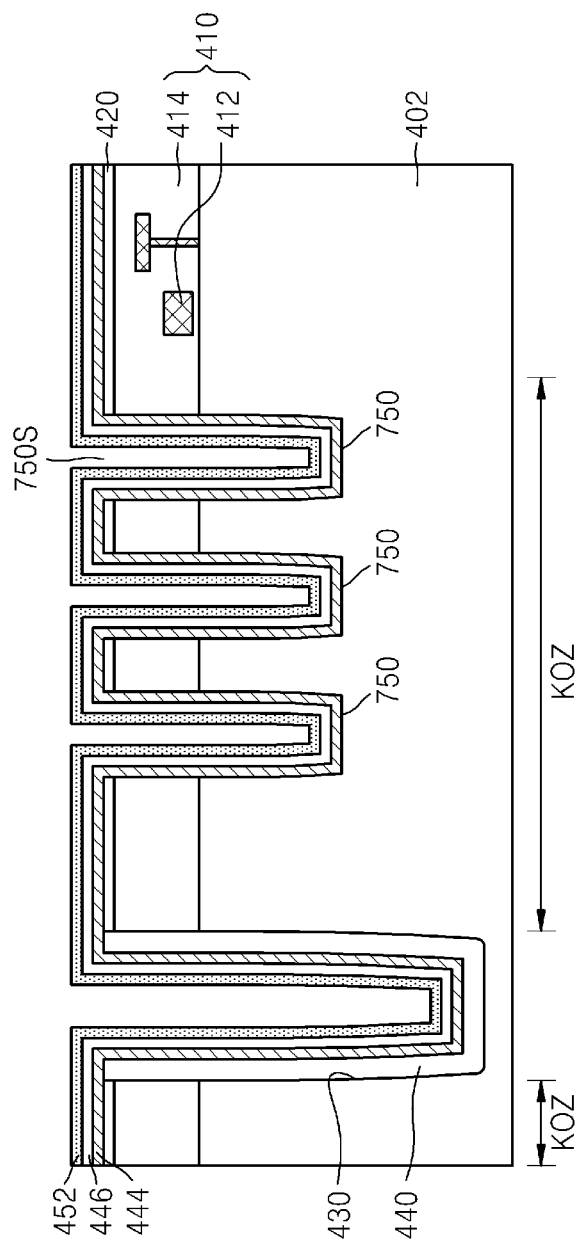

Referring to FIG. 13B, an inner portion of the TSV trench 430, an inner portion of each of the capacitor trenches 750, the first conductive layer 444 provided on the first polishing stop layer 420, the insulating thin film 446, and the second conductive layer 452 may be sequentially formed in a way similar to that described with reference to FIGS. 10E through 10G.

However, a space 750S may remain on the second conductive layer 452 in the capacitor trenches 750.

Figure 13C:
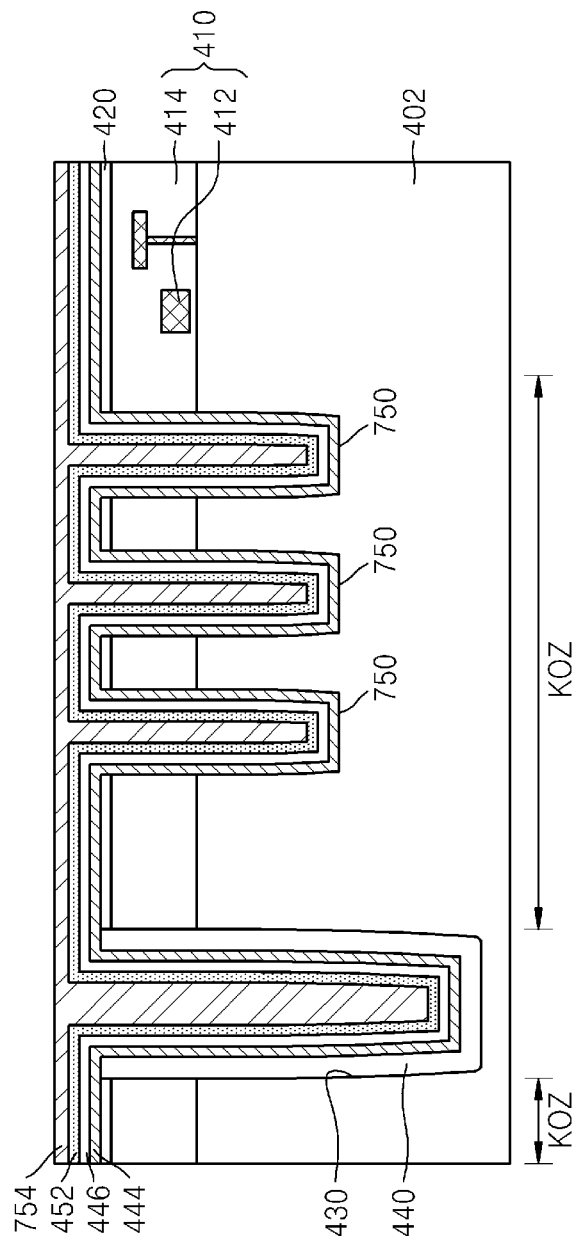

Referring to FIG. 13C, similar to the process of forming the metal layer 454 described with reference to FIG. 10H, a metal layer may be formed on the second conductive layer 452 to fill a space remaining in the TSV trench 430 and the space 750S remaining in the capacitor trenches 750.

Figure 13D:
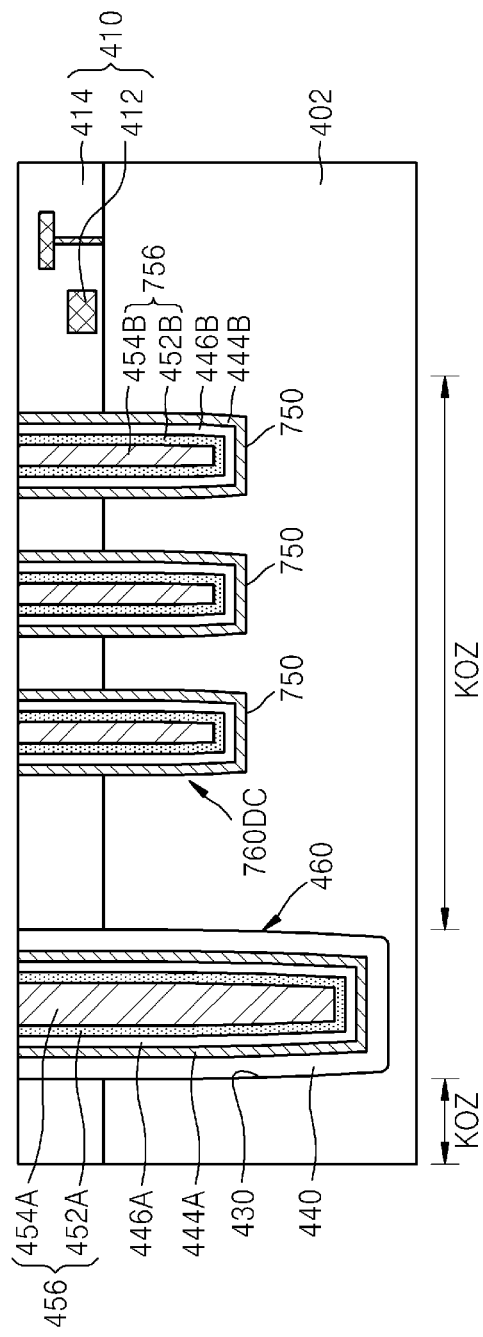

Referring to FIG. 13D, the series of processes described previously with reference to FIGS. 10I through 10J may be performed to remove parts of the via insulating layer 440, the first conductive layer 44, the insulating thin film 446, the second conductive layer 452, and the metal layer 754 that are outside the TSV trench 430 and the capacitor trenches 750. The TSV structure 460 may also be formed in the TSV trench 430, and a plurality of decoupling capacitors 760DC may be formed in the capacitor trenches 750, in a manner similar to that previously described.

The decoupling capacitors 760DC may have approximately the same configuration as that of the decoupling capacitors 460DC described previously with reference to FIGS. 10A through 10O. However, each of the decoupling capacitors 760DC may include a second electrode 756 including the external second electrode layer 452B and the internal second electrode layer 454B. In this regard, the external second electrode layer 452B may be formed from part of the second conductive layer 452 that is different from another part of the second conductive barrier layer 452A of the TSV structure 460, and the internal second electrode layer 454B may be formed from a part of the metal layer 454 that is different from another part of the metal plug 454A of the TSV structure 460. The second electrode 756 of the decoupling capacitors 760DC may be surrounded by the second insulating thin film 446B.

Referring to FIG. 13E, the series of processes described with reference to FIGS. 10K through 10O may be performed to form the remainder of integrated circuit device 700.

In the integrated circuit device 700, the second wiring structure 476B of the multilayer wiring structure 478 may be connected between the second electrode 756 of the decoupling capacitors 760DC and the isopotential conductive layer 472.

Figure 14A:
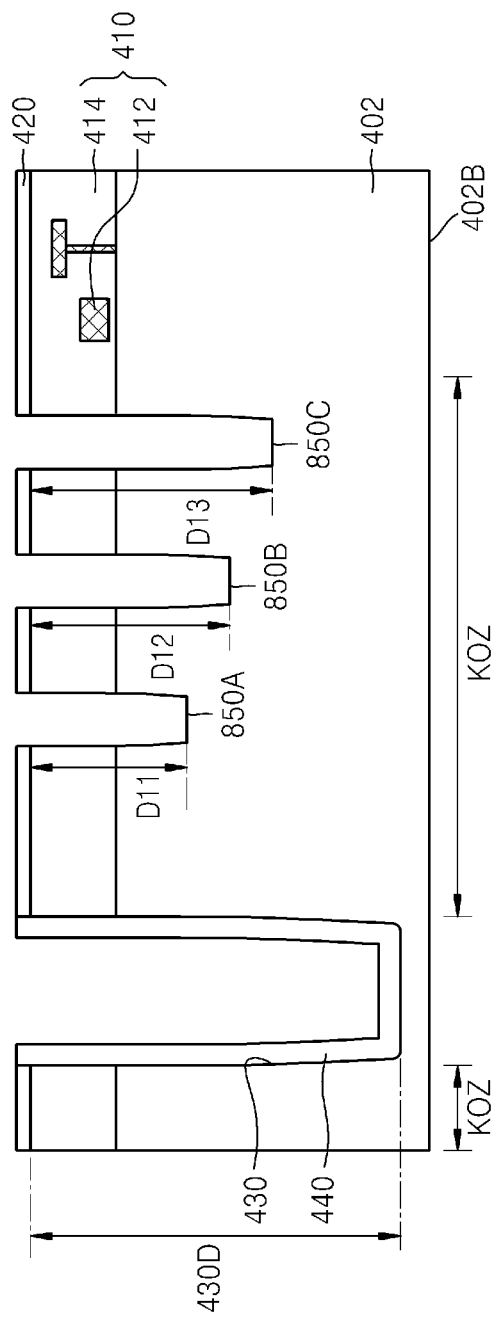
FIGS. 14A and 14B are somewhat schematic cross-sectional views of an integrated circuit device being constructed using a method of manufacturing an integrated circuit device according to another embodiment of the inventive concepts.
Figure 14B:
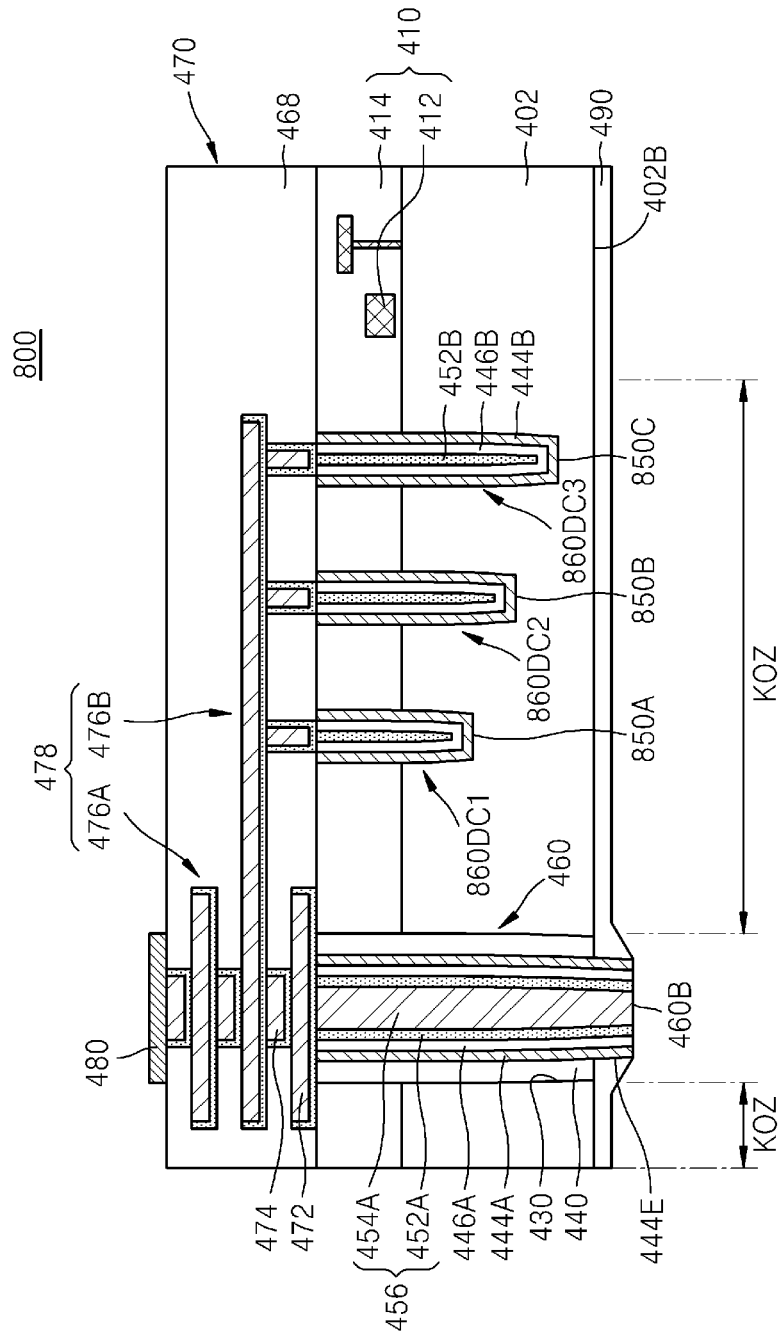

FIGS. 14A and 14B are somewhat schematic cross-sectional views of an integrated circuit device being constructed according to a method of manufacturing an integrated circuit device 800 in another embodiment of the inventive concepts. The same reference numerals denote the same elements, and redundant explanations thereof will not be given.

Referring to FIG. 14A, the TSV trench 430 and the via insulating layer 440 may be formed in a similar way to that described previously with reference to FIGS. 10A through 10D, and a plurality of capacitor trenches 850A, 850B, and 850C may be formed in a KOZ around the TSV trench 430.

However, the capacitor trenches 850A, 850B, and 850C may be formed to have different depths D11, D12, and D13, similar to the trenches 80Q1, 80Q2, and 80Q3 of FIG. 3.

The depths D11, D12, and D13 of the capacitor trenches 850A, 850B, and 850C may be smaller than a depth 430D of the TSV trench 430, and may be determined based on a capacitance required by the integrated circuit device 800.

A plurality of etching processes that use different etching masks, for example, a plurality of RIE processes, may be used to form the capacitor trenches 850A, 850B, and 850C.

Referring to FIG. 14B, the series of processes described with reference to FIGS. 10E through 10O may be performed to form a plurality of decoupling capacitors 860DC1, 860DC2, and 860DC3, simultaneously with the formation of the TSV structure 460.

The decoupling capacitors 860DC1, 860DC2, and 860DC3 may have approximately the same configuration as that of the decoupling capacitors 460DC of FIG. 10O, except that the decoupling capacitors 860DC1, 860DC2, and 860DC3 extend into the substrate 402 with different lengths.

The configuration of the decoupling capacitors 860DC1, 860DC2, and 860DC3 may be similar to that of the decoupling capacitors 70QA, 70QB, and 70QC, respectively, of FIG. 3.

Figure 15A:
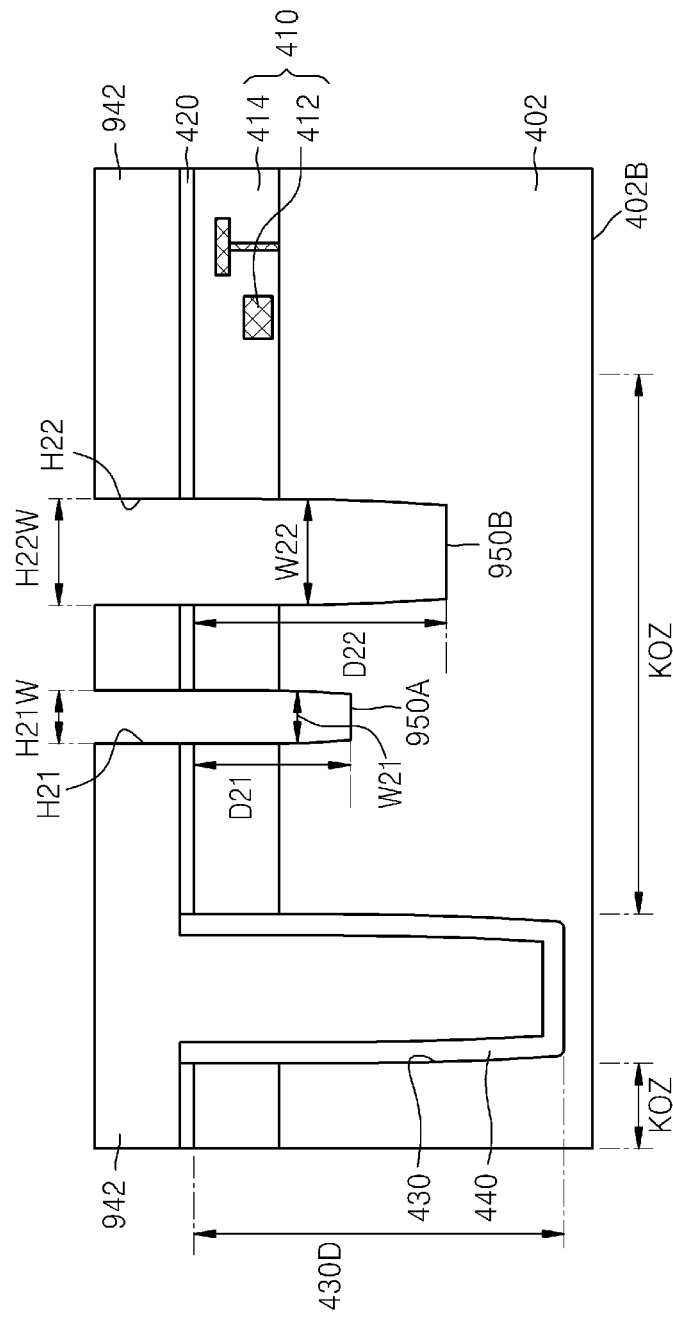
FIGS. 15A and 15B are somewhat schematic cross-sectional views of an integrated circuit device being constructed using a method of manufacturing an integrated circuit device according to another embodiment of the inventive concepts.
Figure 15B:
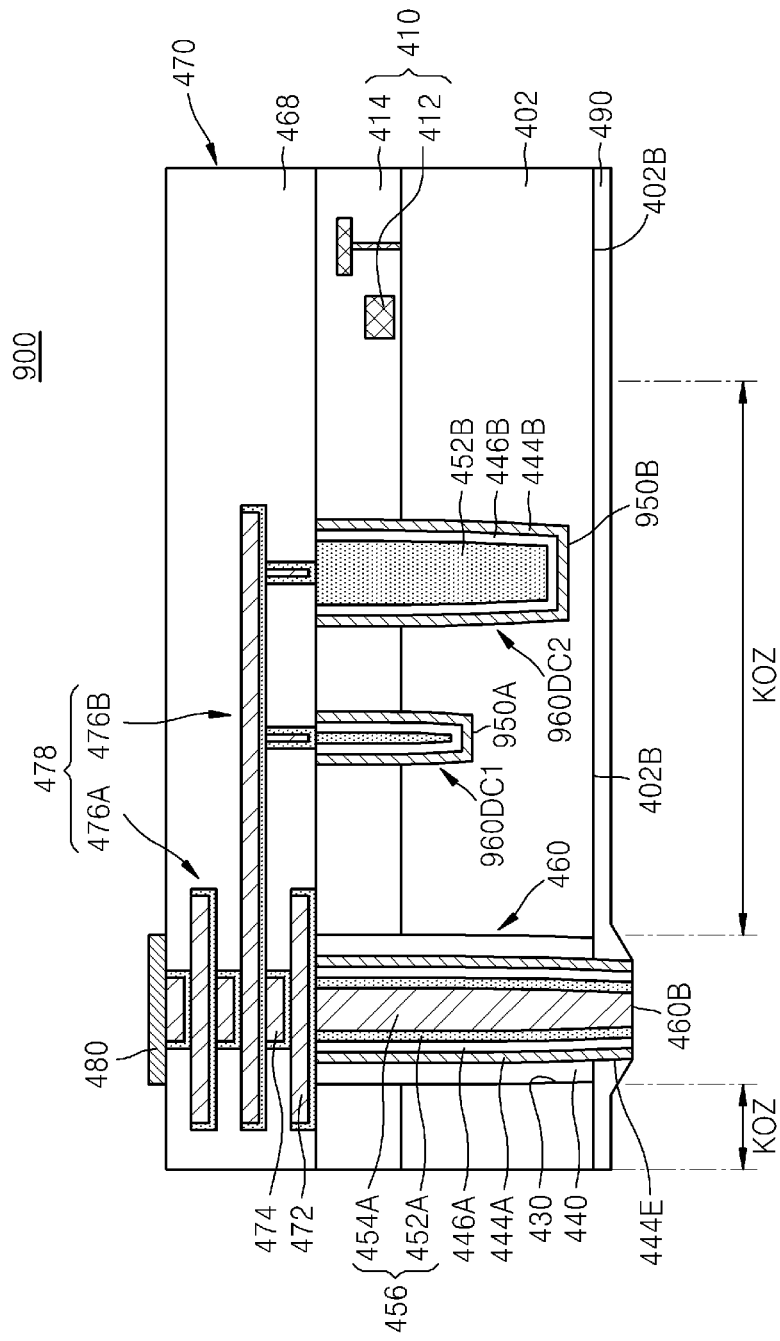

FIGS. 15A and 15B are somewhat schematic cross-sectional views of an integrated circuit device being constructed according to a method of manufacturing an integrated circuit device 900 in another embodiment of the inventive concepts. The same reference numerals denote the same elements, and redundant explanations thereof will not be given.

Referring to FIG. 15A, the TSV trench 430 and the via insulating layer 440 may be formed in a similar way to that described with reference to FIGS. 10A through 10D, and a plurality of capacitor trenches 950A and 950B may be formed in a KOZ around the TSV trench 430.

However, the capacitor trenches 950A and 950B may have different depths D21 and D22 and different widths W21 and W22 than each other. The depths D21 and D22 of the capacitor trenches 950A and 950B may also be smaller than the depth 430D of the TSV trench 430. The depths D21 and D22 and the widths W21 and W22 may be determined based on the capacitance required by the integrated circuit device 900.

To form the capacitor trenches 950A and 950B, a mask pattern 942 including a plurality of holes H21 and H22 with different widths H21W and H22W may be formed on the FEOL structure 410 with the first polishing stop layer 420 disposed therebetween. The first polishing stop layer 420, the interlayer insulating layer 414, and the substrate 402 may then be etched through a RIE process using the mask pattern 942 as an etch mask. The capacitor trenches 950A and 950B may thereby be formed having different widths and depths. In this regard, the capacitor trenches 950A and 950B are formed having different depths D21 and D22 due to an influence of RIE lag. In particular, the capacitor trench 950A formed by an etch process through the hole H21 having a relatively small width may have a smaller depth D21 due to the influence of the RIE lag.

The capacitor trenches 950A and 950B having different depths D21 and D22 and different widths W21 and W22 may be formed using a single etching process that uses a single etch mask.

Referring to FIG. 15B, the via insulating layer 440 and the first polishing stop layer 420 may be exposed by removing the mask pattern 942. The series of processes described with reference to FIGS. 10E through 10O may then be performed to form a plurality of decoupling capacitors 960DC1 and 960DC2 simultaneously with the formation of the TSV structure 460.

The decoupling capacitors 960DC1 and 960DC2 may have approximately the same configuration as that of the decoupling capacitors 460DC of FIG. 10O, except that the decoupling capacitors 960DC1 and 960DC2 may have different lengths and widths than each other.

Figure 16:
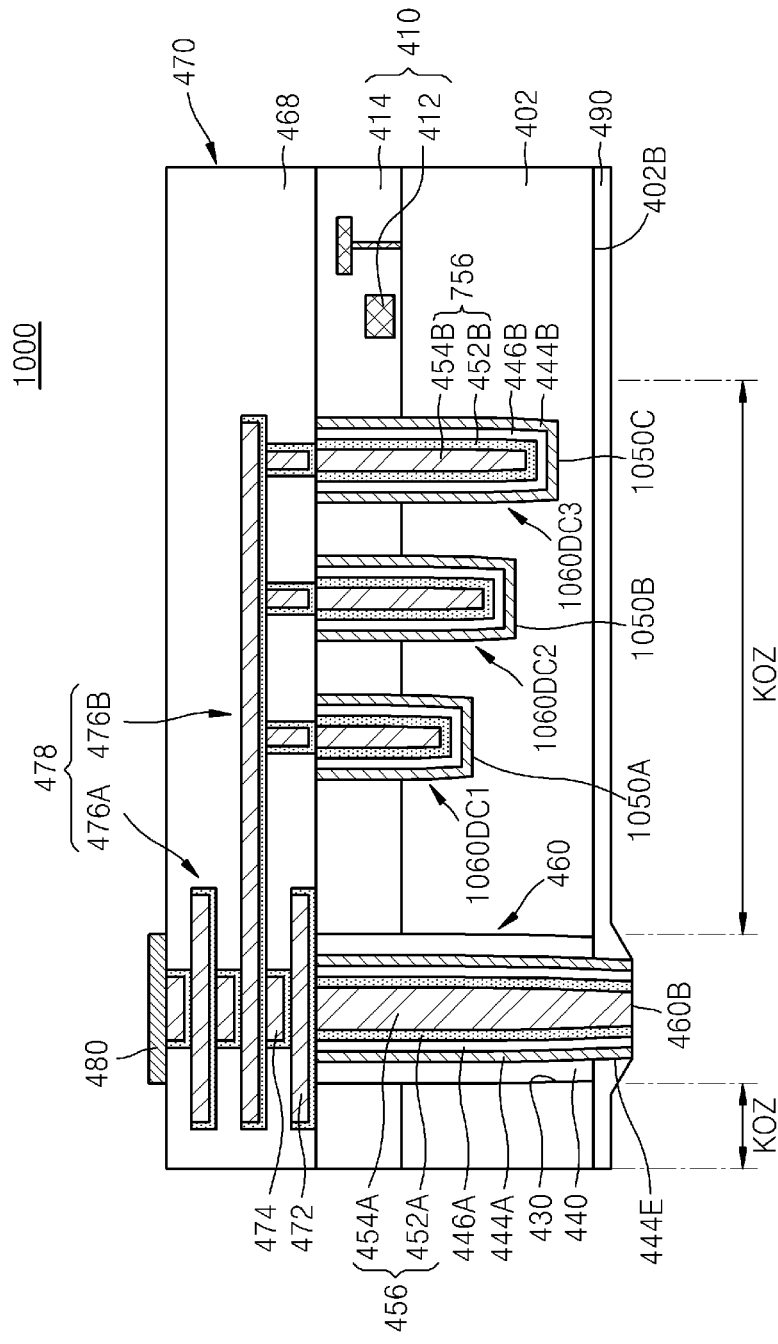
FIG. 16 is a somewhat schematic cross-sectional view of an integrated circuit device for illustrating a method of manufacturing an integrated circuit device according to another embodiment of the inventive concepts.

FIG. 16 is a somewhat schematic cross-sectional view of an integrated circuit device 1000 manufactured according to another embodiment of the inventive concepts. The same reference numerals denote the same elements, and redundant explanations thereof will not be given.

Referring to FIG. 16, the TSV trench 430 and the via insulating layer 440 may be formed in a way similar to that described with reference to FIGS. 10A through 10D, and a plurality of capacitor trenches 1050A, 1050B, and 1050C may be formed in a KOZ around the TSV trench 430.

However, similar to the trenches 80R1, 80R2, and 80R3 of FIG. 4, the capacitor trenches 1050A, 1050B, and 1050C may each have different depths. Depths of the capacitor trenches 1050A, 1050B, and 1050C may also be smaller than the depth 430D (see FIG. 10D) of the TSV trench 430, and may be determined based on the capacitance required by the integrated circuit device 1000.

A plurality of etching processes that use different etching masks, for example, a plurality of RIE processes, may be used to form the capacitor trenches 1050A, 1050B, and 1050C.

Thereafter, the series of processes described with reference to FIGS. 13B through 13E may be performed to form a plurality of decoupling capacitors 1060DC1, 1060DC2, and 1060DC3, simultaneously with the formation of the TSV structure 460.

The decoupling capacitors 1060DC1, 1060DC2, and 1060DC3 may have approximately the same configuration as that of the decoupling capacitors 760DC of FIG. 13E, except that the decoupling capacitors 1060DC1, 1060DC2, and 1060DC3 extend into the substrate 402 with different lengths.

The configuration of the decoupling capacitors 1060DC1, 1060DC2, and 1060DC3 may be similar to that of the decoupling capacitors 70RA, 70RB, and 70RC of FIG. 4.

Figure 17:
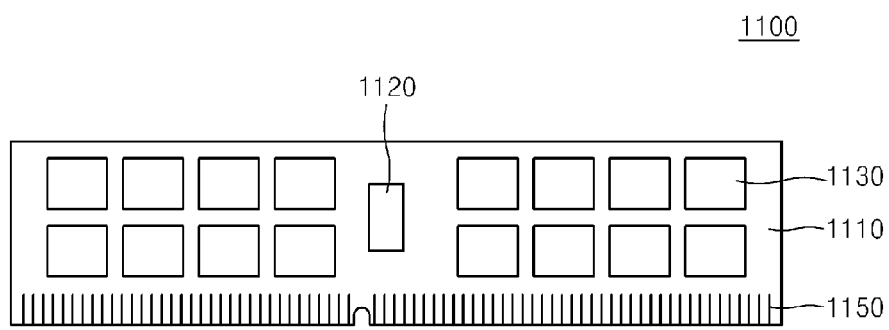
FIG. 17 is a somewhat schematic plan view of an electronic device which can include one or more integrated circuit devices according to an embodiment of the inventive concepts.

FIG. 17 is a somewhat schematic plan view illustrating an electronic device 1100 comprising a plurality of integrated circuit devices constructed according to principles of the inventive concepts.

Referring to FIG. 17, the electronic device 1100 may include a module substrate 1110, a control chip 1120 mounted on the module substrate 1110, and a plurality of semiconductor packages 1130. A plurality of input/output terminals 1150 may be formed in the module substrate 1110.

Each of the semiconductor packages 1130 may include at least one of the integrated circuit devices 10A, 10B, 10C, 10D, 100, 200, 300, 400, 500, 600, 700, 800, 900, and/or 1000 described with reference to FIGS. 1A through 16.

Figure 18:
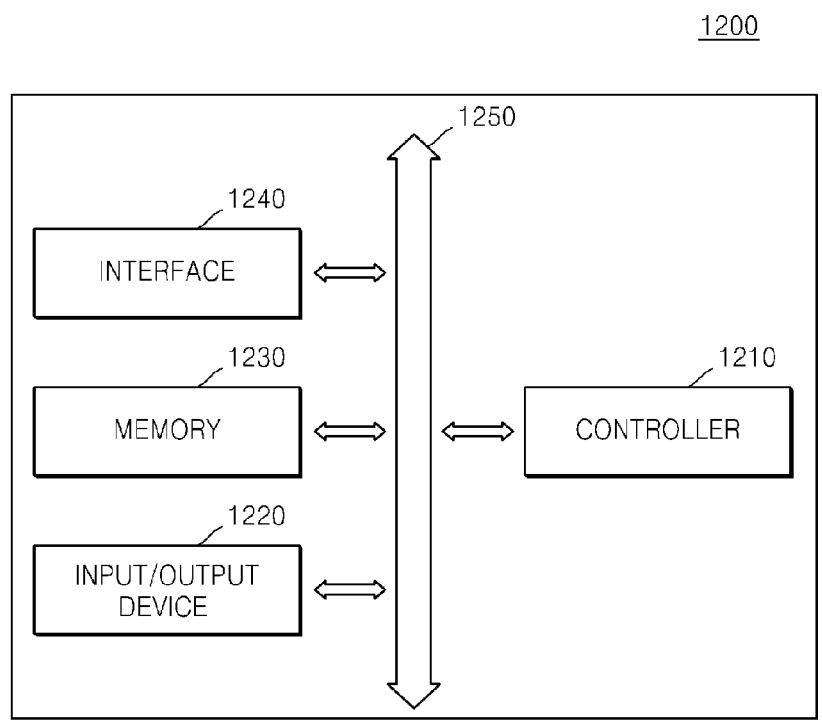
FIG. 18 is a schematic block diagram of an electronic device incorporating one or more integrated circuit devices according to another embodiment of the inventive concepts.

FIG. 18 is a schematic block diagram illustrating elements of an electronic device 1200 according to an embodiment of the inventive concepts.

The electronic device 1200 may include a controller 1210, an input/output device 1220, a memory 1230, and an interface 1240. The electronic device 1200 may be a mobile system or a system that transmits or receives information. In some embodiments, the mobile system may be a personal digital assistant (PDA), a portable computer, a web tablet, a wireless phone, a mobile phone, a digital music player, and/or a memory card.

In some embodiments, the controller 1210 may be a microprocessor, a digital signal processor, or a microcontroller.

The input/output device 1220 is used to input/output data to/from the electronic device 1200. The electronic device 1200 may be connected to an external device such as a personal computer or a network using the input/output device 1220, and may exchange data with the external device. In some embodiments, the input/output device 1220 is a keypad, a keyboard, or a display device.

In some embodiments, the memory 1230 stores code and/or data for operating the controller 1210. In another embodiment, the memory 1230 stores data processed by the controller 1210. At least one of the controller 1210 and the memory 1230 may include at least one of the integrated circuit devices 10A, 10B, 10C, 10D, 100, 200, 300, 400, 500, 600, 700, 800, 900, and 1000 described with reference to FIGS. 1A through 16.

The interface 1240 acts as a path through which data is transmitted between the electronic device 1200 and another external device. The controller 1210, the input/output device 1220, the memory 1230, and the interface 1240 may communicate with one another via a bus 1250.

The electronic device 1200 may, for instance, be included in a mobile phone, an MP3 player, a navigation system, a portable multimedia player (PMP), a solid-state disc (SSD), and/or other household appliances.

While the inventive concepts have been particularly shown and described with reference to exemplary embodiments thereof, it will be understood that various changes in form and details may be made therein without departing from the spirit and scope of the following claims.

What is claimed is:

1. An integrated circuit device comprising:
    a semiconductor structure comprising a semiconductor substrate;
    a through-silicon via (TSV) structure passing through the semiconductor substrate;
    a capacitor formed in the semiconductor substrate and electrically connected to the TSV structure; and
    a first conductive layer and a second conductive layer,
    wherein the TSV structure comprises:
        a conductive plug;
        a first conductive barrier layer spaced apart from the conductive plug and surrounding the conductive plug; and
        a first insulating thin film disposed between the conductive plug and the first conductive barrier layer,
    wherein the capacitor comprises:
        a first electrode formed of the same material as a first material of the first conductive barrier layer;
        a second electrode spaced apart from the first electrode and formed of the same material as a second material of at least a part of the conductive plug; and
        a second insulating thin film disposed between the first electrode and the second electrode and formed of the same material as a third material of the first insulating thin film, and
    wherein the first conductive layer is electrically connected to the conductive plug and the first conductive barrier layer on a first side of the TSV structure and the second conductive layer is electrically connected to the conductive plug and the first conductive barrier layer on a second side of the TSV structure opposite to the first side, and
    wherein the capacitor does not pass through the semiconductor substrate.

2. The integrated circuit device of claim 1, wherein each of the first electrode and the second electrode comprises metal.

3. The integrated circuit device of claim 1, wherein the conductive plug of the TSV structure comprises:
    a metal plug passing through the semiconductor structure and surrounded by the first insulating thin film; and
    a second conductive barrier layer surrounding an external side wall of the metal plug between the metal plug and the first insulating thin film.

4. The integrated circuit device of claim 3, wherein the second electrode of the capacitor comprises the same material as that of the second conductive barrier layer.

5. The integrated circuit device of claim 3, wherein the second electrode of the capacitor has a stack structure comprising a first conductive layer formed of the same material as the metal plug and a second conductive layer formed of the same material as the second conductive barrier layer.

6. The integrated circuit device of claim 1,
    wherein the first conductive barrier layer and the first electrode comprise a first metal, and
    wherein the conductive plug and the second electrode comprise a second metal different from the first metal.

7. The integrated circuit device of claim 1, further comprising:
    a via insulating layer disposed between the semiconductor substrate and the first conductive barrier layer such that the first conductive barrier layer of the TSV structure is spaced apart from the semiconductor substrate,
    wherein the first electrode of the capacitor contacts the semiconductor substrate.

8. The integrated circuit device of claim 1, wherein the semiconductor structure is a part of a logic chip, a memory chip, or an interposer.

9. An integrated circuit device comprising:
    a package substrate comprising a connection terminal;
    a semiconductor structure comprising a semiconductor substrate stacked on the package substrate;
    a TSV structure passing through the semiconductor substrate of the semiconductor structure;
    at least one capacitor formed in the semiconductor substrate of the semiconductor structure and electrically connected to the TSV structure; and
    a first conductive layer and a second conductive layer facing each other with the TSV structure interposed therebetween,
    wherein the TSV structure comprises:
        a conductive plug connected to the connection terminal;
        a first conductive barrier layer spaced apart from the conductive plug and surrounding the conductive plug; and
        a first insulating thin film disposed between the conductive plug and the first conductive barrier layer,
    wherein the at least one capacitor comprises:
        a first electrode formed of the same material as a first material of the first conductive barrier layer;
        a second electrode spaced apart from the first electrode and formed of the same material as a second material of at least a part of the conductive plug; and
        a second insulating thin film disposed between the first electrode and the second electrode and formed of the same material as a third material of the first insulating thin film,
    wherein the first conductive layer is electrically connected to the conductive plug and the first conductive barrier layer on a first side of the TSV structure and the second conductive layer is electrically connected to the conductive plug and the first conductive barrier layer on a second side of the TSV structure opposite to the first side, and wherein the at least one capacitor does not pass through the semiconductor substrate.

10. The integrated circuit device of claim 9, wherein the at least one capacitor comprises a plurality of capacitors that are connected to each other in parallel.

11. The integrated circuit device of claim 10, wherein the plurality of capacitors are formed in a plurality of trenches formed in the semiconductor substrate,
wherein the plurality of trenches are spaced apart from each other.

12. The integrated circuit device of claim 10, wherein the plurality of capacitors are formed in a plurality of trenches formed in the semiconductor substrate,
wherein the plurality of trenches comprise at least two trenches with different depths.

13. The integrated circuit device of claim 1, wherein the first conductive layer faces the second conductive layer with the TSV structure interposed therebetween.

14. The integrated circuit device of claim 1, wherein the first insulating thin film comprises:
a first end contacting the first conductive layer; and
a second end opposite the first end, the second end contacting the second conductive layer.

15. The integrated circuit device of claim 1, wherein the first insulating thin film has a cylindrical structure surrounding the conductive plug.

16. The integrated circuit device of claim 1, further comprising a backside insulating layer covering a back surface of the semiconductor substrate on a side of the semiconductor substrate opposite to the first side of the TSV structure,
wherein the backside insulating layer surrounds a portion of the TSV structure, and
wherein the first conductive barrier layer passes through the backside insulating layer to contact the second conductive layer.

17. The integrated circuit device of claim 9, wherein the first insulating thin film comprises:
a first end contacting the first conductive layer; and
a second end opposite the first end, the second end contacting the second conductive layer.

18. The integrated circuit device of claim 9, wherein the first insulating thin film has a cylindrical structure surrounding the conductive plug.

19. The integrated circuit device of claim 9, further comprising a backside insulating layer covering a back surface of the semiconductor substrate on a side of the semiconductor substrate opposite to the first side of the TSV structure,
wherein the backside insulating layer surrounds a portion of the TSV structure, and
wherein the first conductive barrier layer passes through the backside insulating layer to contact the second conductive layer.

20. The integrated circuit device of claim 19, wherein the at least one capacitor is spaced apart from the backside insulating layer with the semiconductor substrate interposed between the at least one capacitor and the backside insulating layer.

* * * * *